(12) United States Patent
Tran et al.

(10) Patent No.: US 7,939,892 B2
(45) Date of Patent: May 10, 2011

(54) TEST CIRCUIT AND METHOD FOR MULTILEVEL CELL FLASH MEMORY

(75) Inventors: Hieu Van Tran, San Jose, CA (US); Anh Ly, San Jose, CA (US); Sang Thanh Nguyen, Union City, CA (US); Vishal Sarin, Cupertino, CA (US); Hung Q. Nguyen, Fremont, CA (US); William John Saiki, Mountain View, CA (US); Loc B. Hoang, San Jose, CA (US)

(73) Assignee: Silicon Storage Technology, Inc., Chandler, AZ (US)

( * ) Notice: Subject to any disclaimer, the term of this patent is extended or adjusted under 35 U.S.C. 154(b) by 0 days.

(21) Appl. No.: 12/899,120

(22) Filed: Oct. 6, 2010

(65) Prior Publication Data

US 2011/0022905 A1 Jan. 27, 2011

Related U.S. Application Data

(62) Division of application No. 12/637,365, filed on Dec. 14, 2009, now Pat. No. 7,831,872, which is a division of application No. 11/953,754, filed on Dec. 10, 2007, now Pat. No. 7,661,041, which is a division of application No. 10/991,702, filed on Nov. 17, 2004, now Pat. No. 7,325,177.

(51) Int. Cl.
*H01L 23/62* (2006.01)
*H03K 5/08* (2006.01)

(52) U.S. Cl. .................. 257/355; 257/360; 327/310
(58) Field of Classification Search .................. 714/718; 361/56, 111; 257/360, 355; 327/310
See application file for complete search history.

(56) References Cited

U.S. PATENT DOCUMENTS

| | | | |
|---|---|---|---|
| 5,099,143 A | 3/1992 | Arakawa | |
| 5,659,550 A | 8/1997 | Mehrotra et al. | |
| 5,701,024 A * | 12/1997 | Watt | 257/360 |
| 5,825,603 A * | 10/1998 | Parat et al. | 361/111 |
| 5,835,328 A * | 11/1998 | Maloney et al. | 361/111 |
| 5,909,347 A * | 6/1999 | Yu | 361/56 |
| 5,918,117 A * | 6/1999 | Yun | 438/200 |
| 6,004,838 A * | 12/1999 | Ma et al. | 438/200 |
| 6,055,143 A * | 4/2000 | Yu | 361/56 |
| 6,301,157 B1 | 10/2001 | Riva et al. | |
| 6,532,556 B1 | 3/2003 | Wong et al. | |
| 6,724,226 B2 * | 4/2004 | Kim | 327/108 |
| 6,754,107 B2 | 6/2004 | Khouri et al. | |
| 6,768,685 B1 | 7/2004 | Scheuerlein | |
| 6,908,821 B2 * | 6/2005 | Kim | 438/294 |
| 7,050,328 B2 | 5/2006 | Khouri et al. | |
| 7,075,763 B2 * | 7/2006 | Marr | 361/56 |

* cited by examiner

*Primary Examiner* — James C Kerveros
(74) *Attorney, Agent, or Firm* — DLA Piper LLP (US)

(57) ABSTRACT

A test device and method may be used to detect voltage, current or signals of a digital multilevel memory cell system or to test operation or performance by applying inputted voltages, currents or signals to the memory cell system.

10 Claims, 13 Drawing Sheets

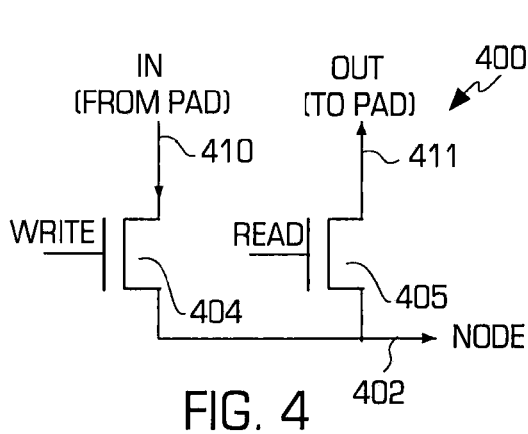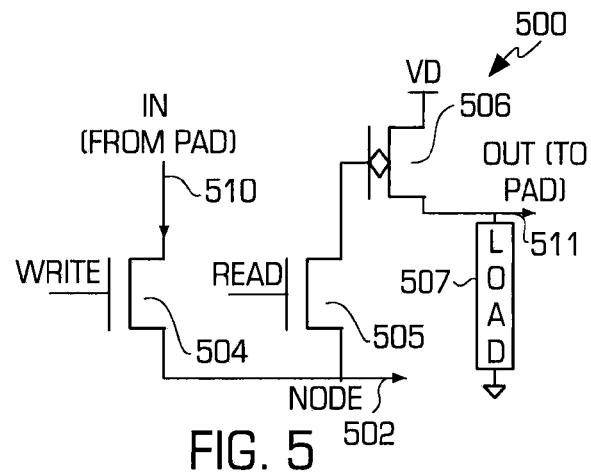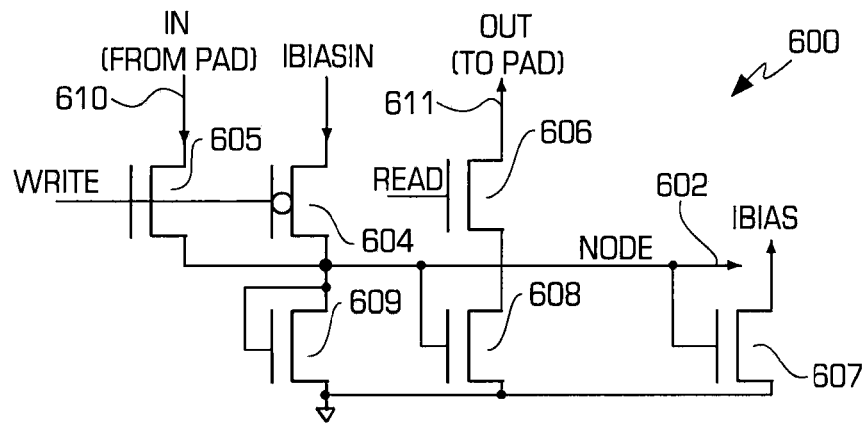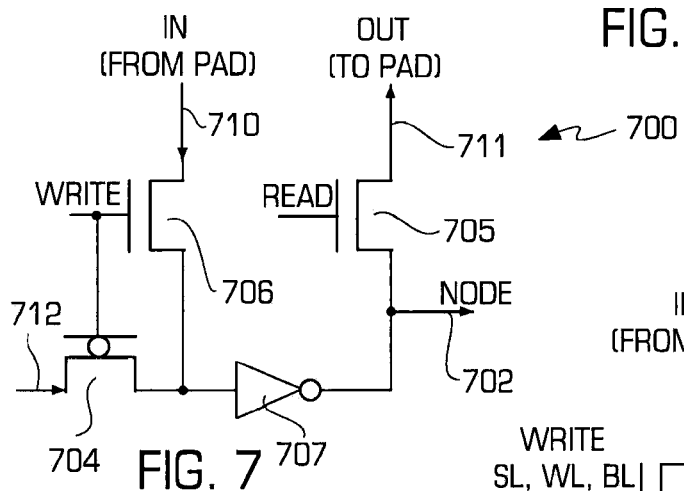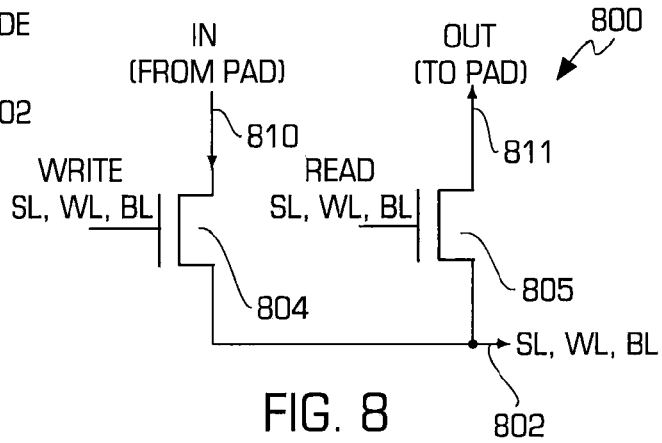

TEST CIRCUIT AND METHOD FOR MULTILEVEL CELL FLASH MEMORY

RELATED APPLICATION

This application is a divisional application of U.S. patent application Ser. No. 12/637,365 filed on Dec. 14, 2009, now U.S. Pat. No. 7,831,872, which is a divisional of patent application Ser. No. 11/953,754 filed on Dec. 10, 2007, now U.S. Pat. No. 7,661,041, and which is a divisional of patent application Ser. No. 10/991,702 filed on Nov. 17, 2004, now U.S. Pat. No. 7,325,177, the subject matter of all are incorporated herein it its entirety.

BACKGROUND

The present invention relates to test circuits and methods, and more particularly to test circuits and methods for multilevel cell flash memory.

Many systems include test circuits for measuring voltages or currents within the system or for measuring the performance of a system by introducing predefined voltages or currents. The test circuit may impact the performance of the system being tested or may allow the introduction of electrostatic discharge to thereby damage the system being tested. The testing of multilevel memory is typically long compared to testing of single level memory.

SUMMARY

In one aspect, a test circuit comprises a first node for coupling to a digital multilevel memory system. A first switch selectively couples an input node to the first node in response to a first signal indicative of a write mode of the digital multilevel memory system. The second switch selectively couples the first node to an output node in response to a second signal indicative of a read mode of the digital multilevel memory system.

In another aspect, a mass operation may be used for a read operation to speed up testing. In one aspect, a memory is tested by placing a plurality of programmed memory cells in a voltage sensing mode, detecting leakage current on a bit line coupled to said plurality of programmed memory cells, and reading content stored in said plurality of programmed memory cells in the event said detected leakage current exceeds a threshold.

In yet another aspect, a memory is tested by placing a plurality of erased memory cells in a current sensing mode, setting a bit line coupled to the plurality of erased memory cells to a zero voltage, detecting an output voltage, and read the content stored in said plurality of erased memory cells in the event that the detected output voltage is below a threshold.

In yet another aspect, a transceiver may enable testing of high voltage and low voltage signals. In one aspect, a test transceiver comprises a transmission circuit including a plurality of MOS transistors coupled in series between a high voltage node and a test node, also comprises a first clamp circuit coupled to a gate of at least one of the plurality of MOS transistors to control voltage on the gate in response to a first voltage, and further comprises a second clamp circuit coupled to a gate of at least another one of the plurality of MOS transistors to control voltage on the gate in response to a second voltage in which the voltage on the gates is maintained at intermediate voltages to avoid breakdown of the MOS transistors.

BRIEF DESCRIPTION OF THE DRAWINGS

FIG. 4 is a schematic diagram illustrating a first embodiment of a test circuit.

FIG. 5 is a schematic diagram illustrating a second embodiment of a test circuit.

FIG. 6 is a schematic diagram illustrating a third embodiment of a test circuit.

FIG. 7 is a schematic diagram illustrating a fourth embodiment of a test circuit.

FIG. 8 is a schematic diagram illustrating a fifth embodiment of a test circuit.

DETAILED DESCRIPTION

Test circuits may be used for testing performance of systems such as multilevel memory systems. The test circuit may introduce at a test node voltages or currents into the system or may measure simultaneously at the same test node or different test nodes signals in the system.

Figure 1:
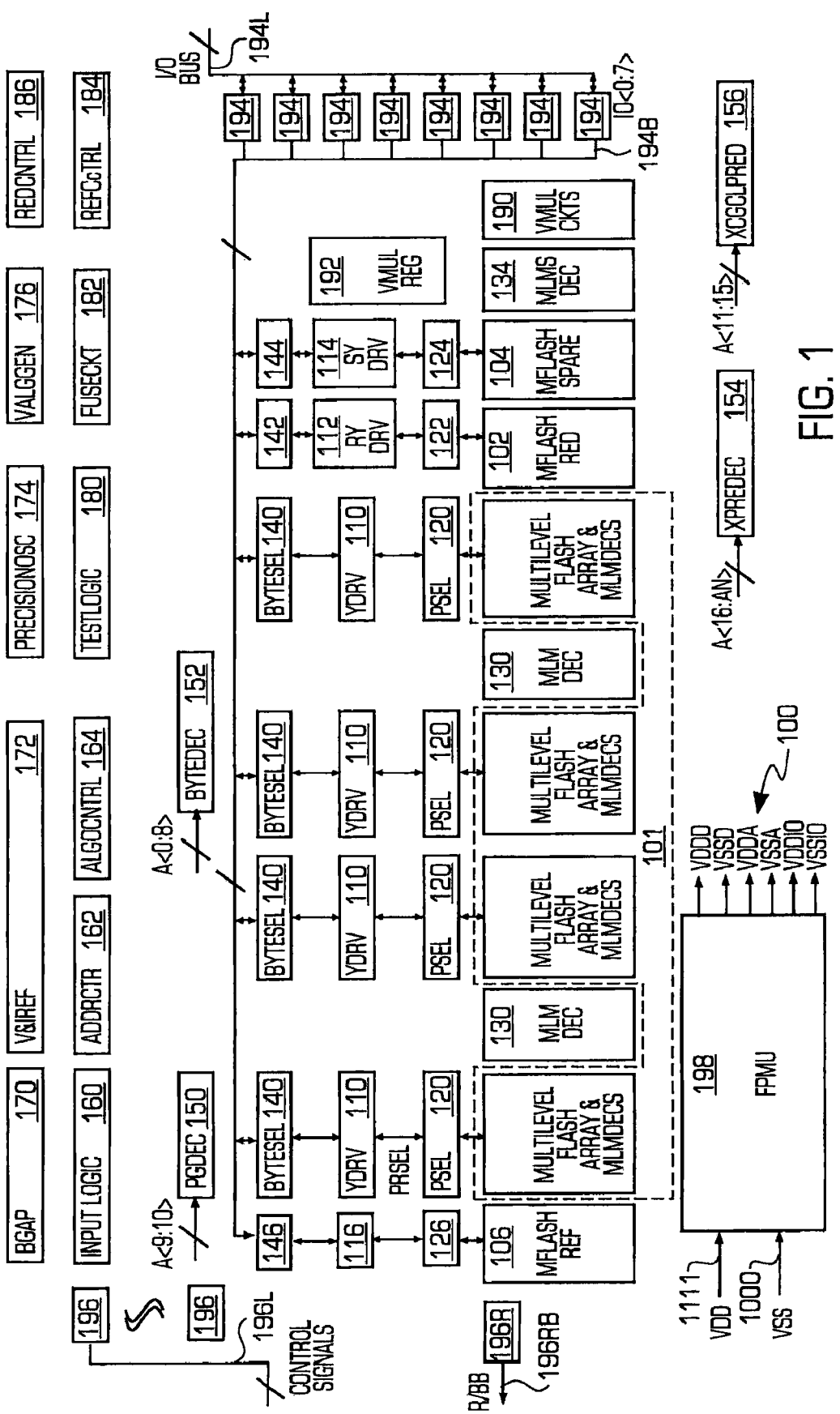
FIG. 1 is a block diagram illustrating a digital multilevel memory data storage system.

FIG. 1 is a block diagram illustrating a digital multilevel bit memory array system 100. For clarity, some signal lines of the memory array system 100 are not shown in FIG. 1.

In one embodiment, the memory array includes a source side injection flash technology, which uses lower power in hot electron programming, and efficient injector based Fowler-Nordheim tunneling erasure. The programming may be done by applying a high voltage on the source of the memory cell, a bias voltage on the control gate of the memory cell, and a bias current on the drain of the memory cell. The programming in effect places electrons on the floating gate of memory cell. The erase is done by applying a high voltage on the control gate of the memory cell and a low voltage on the source and/or drain of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the drain (bitline) to a low bias voltage such as ground, and the voltage on the drain is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the drain (bitline) from a high voltage supply, and the voltage on the load is the readout voltage. In one embodiment, the array architecture and operating methods may be the ones disclosed in U.S. Pat. No. 6,282,145, entitled "Array Architecture and Operating Methods for Digital Multilevel Nonvolatile Memory Integrated Circuit System" by Tran et al., the subject matter of which is incorporated herein by reference.

The digital multilevel bit memory array system 100 includes a plurality of regular memory arrays 101, a plurality of redundant memory arrays (MFLASHRED) 102, a spare array (MFLASHSPARE) 104, and a reference array (MFLASHREF) 106. An N-bit digital multilevel cell is defined as a memory cell capable of storing $2^N$ levels.

In one embodiment, the memory array system 100 stores one gigabits of digital data with 4-bit multilevel cells, and the regular memory arrays 101 are equivalently organized as 8,192 columns and 32,768 rows. Addresses A<12:26> are used to select a row, and addresses A<0:11> are used to select two columns for one byte. A page is defined as a group of 512 bytes corresponding to 1,024 columns or cells on a selected row. A page is selected by the A<9:11> address. A row is defined here as including 8 pages. A byte within a selected page is selected by the address A<0:8>. Further, for each page of 512 regular data bytes, there are 16 spare bytes that are selected by the address A<0:3>, which are enabled by other control signals to access the spare array and not the regular array as is normally the case. Other organizations are possible such as a page including 1024 bytes or a row including 16 or 32 pages.

The reference array (MFLASHREF) 106 is used for a reference system of reference voltage levels to verify the contents of the regular memory array 101. In another embodiment, the regular memory arrays 101 may include reference memory cells for storing the reference voltage levels.

The redundancy array (MFLASHRED) 102 is used to increase production yield by replacing bad portions of the regular memory array 101.

The spare array (MFLASHSPARE) 104 may be used for extra data overhead storage such as for error correction and/or memory management (e.g., status of a selected block of memory being erased or programmed, number of erase and program cycles used by a selected block, or number of bad bits in a selected block). In another embodiment, the digital multilevel bit memory array system 100 does not include the spare array 104.

The digital multilevel bit memory array system 100 further includes a plurality of y-driver circuits 110, a plurality of redundant y-driver circuits (RYDRV) 112, a spare y-driver circuit (SYDRV) 114, and a reference y-driver (REFYDRV) circuit 116.

The y-driver circuit (YDRV) 110 controls bit lines (also known as columns, not shown in FIG. 1) during write, read, and erase operations. Each y-driver (YDRV) 110 controls one bitline at a time. Time multiplexing may be used so that each y-driver 110 controls multiple bit lines during each write, read, and erase operation. The y-driver circuits (YDRV) 110 are used for parallel multilevel page writing and reading to speed up the data rate during write to and read from the regular memory array 101. In one embodiment, for a 512-byte page with 4-bit multilevel cells, there are a total of 1024 y-drivers 110 or a total of 512 y-drivers 300.

The reference y-driver circuit (REFYDRV) 116 is used for the reference array (MFLASHREF) 106. In one embodiment, for a 4-bit multilevel cell, there are a total of 15 or 16 reference y-drivers 116. The function of the reference y-driver 116 may be similar to that of the y-driver circuit 110.

The redundant y-driver circuit (RYDRV) 112 is used for the redundant array (MFLASHRED) 102. The function of redundant y-driver circuit (RYDRV) 112 may be similar to that of the y-driver circuit (YRDRV) 110.

The spare y-driver circuit (SYDRV) 114 includes a plurality of single spare y-drivers (SYDRV) 114 used for the spare array (MFLASHSPARE) 104. The function of the spare y-driver circuit (SYDRV) 114 may be similar to the function of the y-driver circuit (YDRV) 110. In one embodiment, for a 512-byte page with 4-bit multilevel cells with 16 spare bytes, there are a total of 32 spare y-drivers 114.

The digital multilevel bit memory array system 100 further includes a plurality of page select (PSEL) circuits 120, a redundant page select circuit 122, a spare page select circuit 124, a reference page select circuit 126, a plurality of block decoders (BLKDEC) 130, a multilevel memory precision spare decoder (MLMSDEC) 134, a byte select circuit (BYTESEL) 140, a redundant byte select circuit 142, a spare byte select circuit 144, a reference byte select circuit 146, a page address decoder (PGDEC) 150, a byte address decoder (BYTEDEC) 152, an address pre-decoding circuit (X PREDEC) 154, an address pre-decoding circuit (XCGCLPRE1) 156, an input interface logic (INPUTLOGIC) 160, and an address counter (ADDRCTR) 162.

The page select circuit (PSEL) 120 selects one bit line (not shown) out of multiple bitlines for each single y-driver (YDRV) 110. In one embodiment, the number of multiple bitlines connected to a single y-driver (YDRV) 110 is equal to the number of pages. The corresponding select circuits for the reference array 106, the redundant memory array 102, and the spare memory array 104 are the reference page select circuit 126, the redundant page select circuit 122, and the spare page select circuit 124, respectively.

The byte select circuit (BYTESEL) 140 enables one byte data in or one byte data out of a pair of the y-driver circuits (YDRV) 110 at a time. The corresponding byte select circuits for the reference array 106, the redundant memory array 102, and the spare memory array 104 are the reference byte select circuit 146, the redundant byte select circuit 142, and the spare byte select circuit 144, respectively.

The block decoder (BLKDEC) 130 selects a row or a block of rows in the arrays 101 and 102 based on the signals from the address counter 162 (described below) and provides precise multilevel bias values over temperature, process, and power supply used for consistent single level or multilevel memory operation for the regular memory array 101 and the redundant memory array 102. The multilevel memory precision spare decoder (MLMSDEC) 134 selects a spare row or block of spare rows in the spare array 104 and provides precise multilevel bias values over temperature, process corners, and power supply used for consistent multilevel memory operation for the spare array 104. The intersection of a row and column selects a cell in the memory array. The intersection of a row and two columns selects a byte in the memory array.

The address pre-decoding circuit 154 decodes addresses. In one embodiment, the addresses are A<16:26> to select a block of memory array with one block comprising 16 rows. The outputs of the address pre-decoding circuit 154 are coupled to the block decoder 130 and the spare decoder 134. The address pre-decoding circuit 156 decodes addresses. In one embodiment, the addresses are addresses A<12:15> to select one row out of sixteen within a selected block. The outputs of address pre-decoding circuit 156 are coupled to the block decoder 130 and the spare decoder 134.

The page address decoder 150 decodes page addresses, such as A<9:11>, to select a page, e.g., P<0:7>, and provides its outputs to the page select circuits 120, 122, 124, and 126. The byte address decoder 152 decodes byte addresses, such as A<0:8>, and provides its outputs to the byte select circuit 140 to select a byte. The byte predecoder 152 also decodes spare byte address, such as A<0:3> and AEXT (extension address), and provides its outputs to the spare byte select circuit 144 to select a spare byte. A spare byte address control signal AEXT is used together with A<0:3> to decode addresses for the spare array 104 instead of the regular array 101.

The address counter (ADDRCTR) 162 provides addresses A<11:AN>, A<9:10>, and A<0:8> for row, page, and byte addresses, respectively. The outputs of the address counter (ADDRCTR) 162 are coupled to circuits 154, 156, 150, and 152. The inputs of the address counter (ADDRCTR) 162 are coupled from the outputs of the input interface logic (INPUTLOGIC) 160.

The input interface logic circuit (INPUTLOGIC) 160 provides an external interface to external systems, such as an external system microcontroller. Typical external interface for memory operations are read, write, erase, status read, identification (ID) read, ready busy status, reset, and other general purpose tasks. A serial interface can be used for the input interface to reduce pin counts for a high-density chip due to a large number of addresses. Control signals (not shown) couple the input interface logic circuit (INPUTLOGIC) 160 to the external system microcontroller. The input interface logic circuit (INPUTLOGIC) 160 includes a status register that indicates the status of the memory chip operation such as pass or fail in program or erase, ready or busy, write protected or unprotected, cell margin good or bad, restore or no restore, and the like.

The digital multilevel bit memory array system 100 further includes an algorithm controller (ALGOCNTRL) 164, a band gap voltage generator (BGAP) 170, a voltage and current bias generator (V&IREF) 172, a precision oscillator (OSC) 174, a voltage algorithm controller (VALGGEN) 176, a test logic circuit (TESTLOGIC) 180, a fuse circuit (FUSECKT) 182, a reference control circuit (REFCNTRL) 184, a redundancy controller (REDCNTRL) 186, voltage supply and regulator (VMULCKTS) 190, a voltage multiplexing regulator (VMULREG) 192, input/output (IO) buffers 194, and an input buffer 196.

The algorithm controller (ALGOCNTRL) 164 is used to handshake the input commands from the input logic circuit (INPUTLOGIC) 160 and to execute the multilevel erase, programming and sensing algorithms used for multilevel nonvolatile operation. The algorithm controller (ALGOCNTRL) 164 is also used to algorithmically control the precise bias and timing conditions used for multilevel precision programming.

The test logic circuit (TESTLOGIC) 180 tests various electrical features of the digital circuits, analog circuits, memory circuits, high voltage circuits, and memory array. The inputs of the test logic circuit (TESTLOGIC) 180 are coupled from the outputs of the input interface logic circuit (INPUTLOGIC) 160. The test logic circuit (TESTLOGIC) 180 also provides timing speed-up in production testing such as in faster write/read and mass modes. The test logic circuit (TESTLOGIC) 180 also provides screening tests associated with memory technology such as various disturb and reliability tests. The test logic circuit (TESTLOGIC) 180 also allows an off-chip memory tester to directly take over the control of various on-chip logic and circuit bias circuits to provide various external voltages and currents and external timing. This feature permits, for example, screening with external voltage and external timing or permits accelerated production testing with fast external timing. The test logic circuit 180 may include test circuits such as those described below in conjunction with FIGS. 4-10.

The fuse circuit (FUSECKT) 182 is a set of nonvolatile memory cells configured at the external system hierarchy, at the tester, at the user, or on chip on-the-fly to achieve various settings. These settings can include precision bias values, precision on-chip oscillator frequency, programmable logic features such as write-lockout feature for portions of an array, redundancy fuses, multilevel erase, program and read algorithm parameters, or chip performance parameters such as write or read speed and accuracy.

The reference control circuit (REFCNTRL) 184 is used to provide precision reference levels for precision voltage values used for multilevel programming and sensing. The redundancy controller (REDCNTRL) 186 provides redundancy control logic.

The voltage algorithm controller (VALGGEN) 176 provides various specifically shaped voltage signals of amplitude and duration used for multilevel nonvolatile operation and to provide precise voltage values with tight tolerance, used for precision multilevel programming, erasing, and sensing. A bandgap voltage generator (BGAP) 170 provides a precise voltage value over process, temperature, and supply for multilevel programming and sensing.

The voltage and current bias generator (V&IREF) 172 is a programmable bias generator. The bias values are programmable by the settings of control signals from the fuse circuit (FUSECKT) 182 and also by various metal options. The oscillator (OSC) 174 is used to provide accurate timing for multilevel programming and sensing.

The input buffer 196 provides buffers for input/output with the memory array system 100. The input buffer 196 buffers an input/output line 197 coupled to an external circuit or system, and an input/output bus 194B, which couples to the arrays 101, 102, 104, and 106 through the y-drivers 110, 112, 114, and 116, respectively. In one embodiment, the input buffer 196 includes TTL input buffers or CMOS input buffers. In one embodiment, the input buffer 196 includes an output buffer with slew rate control or an output buffer with value feedback control. Input/output (IO) buffer blocks 194 includes typical input buffers and typical output buffers. A typical output buffer is, for example, an output buffer with slew rate control, or an output buffer with level feedback control. A circuit block 196R is an open drained output buffer and is used for ready busy handshake signal (R/RB) 196RB.

The voltage supply and regulator (VMULCKT) 190 provides regulated voltage values above or below the external power supply used for erase, program, read, and production tests. In one embodiment, the voltage supply and regulator 190 includes a charge pump or a voltage multiplier. The voltage multiplying regulator (VMULREG) 192 provides regulation for the regulator 190 for power efficiency and for transistor reliability such as to avoid various breakdown mechanisms.

The system 100 may execute various operations on the memories 101, 102, 104, and 106. An erase operation may be done to erase all selected multilevel cells by removing the charge on selected memory cells according to the operating requirements of the non-volatile memory technology used. A data load operation may be used to load in a plurality of bytes of data to be programmed into the memory cells, e.g., 0 to 512 bytes in a page. A read operation may be done to read out in parallel a plurality of bytes of data if the data (digital bits), e.g., 512 bytes within a page, stored in the multilevel cells. A program operation may be done to store in parallel a plurality of bytes of data in (digital bits) into the multilevel cells by placing an appropriate charge on selected multilevel cells depending on the operating requirements of the non-volatile memory technology used. The operations on the memory may be, for example, the operations described in U.S. Pat. No. 6,282,145, incorporated herein by reference above.

Control signals (CONTROL SIGNALS) 196L, input/output bus (IO BUS) 194L, and ready busy signal (R/BB) 196RB are for communication with the system 100.

A flash power management circuit (FPMU) 198 manages power on-chip such as powering up only the circuit blocks in use. The flash power management circuit 198 also provides isolation between sensitive circuit blocks from the less sensitive circuit blocks by using different regulators for digital power (VDDD)/(VSSD), analog power (VDDA) (VSSA), and IO buffer power (VDDIO)/(VSSIO). The flash power management circuit 198 also provides better process reliability by stepping down power supply VDD to lower levels required by transistor oxide thickness. The flash power management circuit 198 allows the regulation to be optimized for each circuit type. For example, an open loop regulation could be used for digital power since highly accurate regulation is not required; and a closed loop regulation could be used for analog power since analog precision is normally required. The flash power management also enables creation of a "green" memory system since power is efficiently managed.

Figure 2:
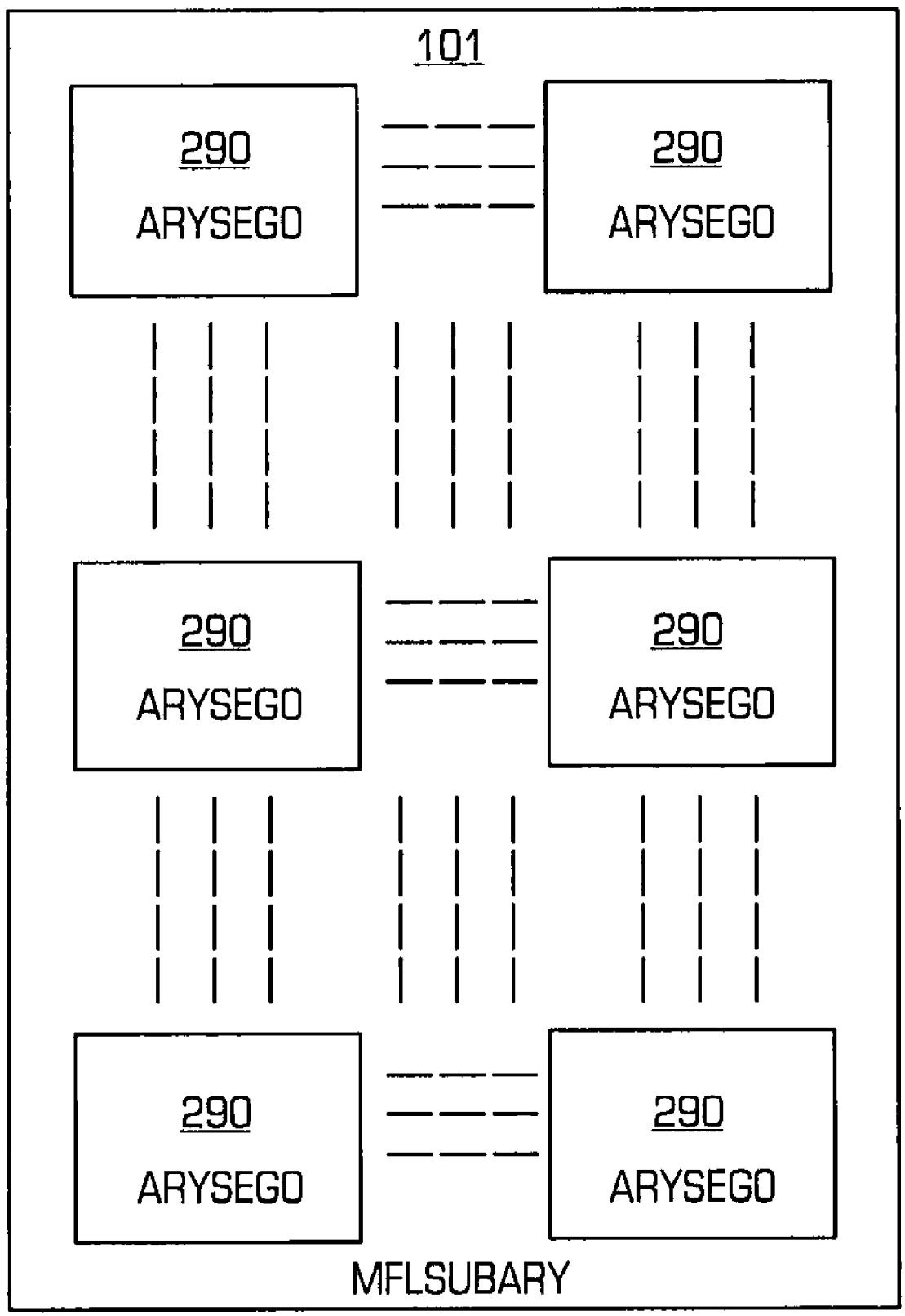
FIG. 2 is a block diagram illustrating a block of a memory array of the digital multilevel memory data storage system of FIG. 1.

FIG. 2 is a block diagram illustrating a block of a memory array 101.

A block (MFLSUBARY) 101 includes a plurality of blocks (ARYSEG0) 290. Blocks (ARYSEG0) 290 are first tiled horizontally NH times and then the horizontally tiled blocks 290 are tiled vertically NV times. For a page with 1024 memory cells, NH is equal to 1024. NV is determined such that the total number of memory cells is equal to the size of the desired physical memory array.

The blocks 290 comprise a plurality of memory arrays that may be arranged in rows and columns. Sense amplifiers may be disposed locally in a block 290 or globally in the memory array 101 or a combination of both.

Figure 3:
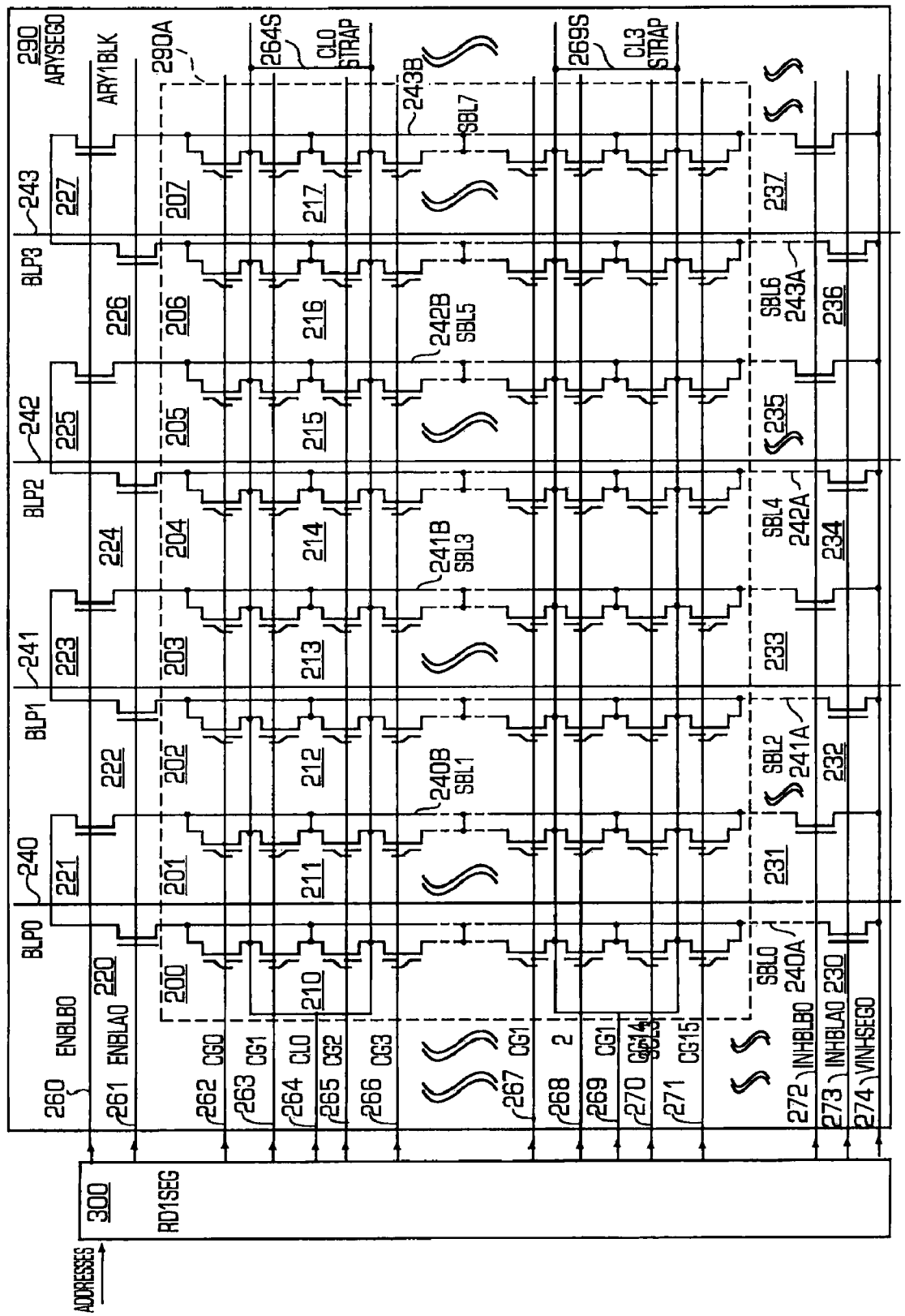
FIG. 3 is a schematic diagram illustrating an array segment of the block of the memory array of FIG. 2.

FIG. 3 is a schematic diagram illustrating an array segment 290.

A plurality of blocks (RD1SEG) 300 are multi-level decoders and comprise a portion of the decoder (MLMDEC) 130 (FIG. 1). In the block (ARYSEG0) 290, there are 8 columns and FIG. 3 shows only 8 rows of memory cells, while other rows, e.g., 120 rows, are not shown for clarity. Each ARYSEG0 290 includes a plurality, e.g. 8, of array blocks (ARYLBLK) 290A tiled vertically. A set of transistors 220, 221, 222, 223, 224, 225, 226, 227 couples a set of segment bitlines (SBLO) 240A and (SBL1) 240B, (SBL2) 241A and (SBL3) 241B, (SBL4) 242A and (SBL5) 242B, (SBL6) 243A and (SBL7) 243B, respectively, to a set of top bitlines (BLP0) 240, (BLP1) 241, (BLP2) 242, and (BLP3) 243, respectively. Top bitlines refer to bitlines running on top of the whole array and running the length of the MFLSUBARY 101. Segment bitlines refer to bitlines running locally within a basic array unit ARYSEG0 290. A set of transistors 230, 231, 232, 233, 234, 235, 236, 237 couples respectively segment bitlines (SBL0) 240A and (SBL1) 240B, (SBL2) 241A and (SBL3) 241B, (SBL4) 242A and (SBL5) 242B, (SBL6) 243A and (SBL7) 243B to an inhibit line (VINHSEGO) 274. A line (CL0) 264 is the common line coupled to common lines of the first four rows of memory cells. A line (CL3) 269 couples to common lines of the last four rows of memory cells. A set of control gates (CG0) 262, (CG1) 263, (CG2) 265, (CG3) 266 couples to control gates of memory cells of the first four rows respectively. A set of control gates (CG12) 267, (CG13) 268, (CG14) 270, (CG15) 271 couples to control gates of memory cells of the last four rows, respectively. A pair of inhibit select lines INHBLB0 272 and INHBLB1 273 couples to gates of transistors 231, 233, 235, 237 and transistors 230, 232, 234, 236 respectively. A pair of bitline select lines (ENBLB0) 260 and (ENBLA0) 261 couples to gates of transistors 221, 223, 225, 227 and transistors 220, 222, 224, 226, respectively.

Multiple units of the basic array unit (ARYSEG0) 290 are tiled together to make up one sub-array (MFLSUBARY) 101 as shown in FIG. 2. And multiples of such (MFLSUBARY) 101 are tiled horizontally to make up the final 8192 columns for a total of 32768'8192=268,435,460 physical memory cells, or called 256 mega cells. The logical array size is 256 mega cells×4 bits per cell=1 giga bits if 4-bit digital multilevel memory cell is used or 256 mega cells×8 bits per cell=2 giga bits if 8-bit digital multilevel memory cell is used. The top bitlines (BLP0) 240, (BLP1) 241, (BLP2) 242, and (BLP3) 243 run from the top of the array to the bottom of the array. The segment bitlines (SBL0) 240A, (SBL1) 240B, (SBL2) 241A, (SBL3) 241B, (SBL4) 242A, (SBL5) 242B, (SBL6) 243A, and (SBL7) 243B only run as long as the number of rows within a segment, for example, 128 rows. Hence the capacitance contributed from each segment bitline is very small, e.g., 0.15 pF.

The layout arrangement of the top bitlines 240-243 in relative position with each other and with respect to the segment bitlines (SBL0) 240A, (SBL1) 240B, (SBL2) 241A, (SBL3) 241B, (SBL4) 242A, (SBL5) 242B, (SBL6) 243A, (SBL7) 243B are especially advantageous in reducing the bitline capacitance. The purpose is to make the top bitlines as truly floating as possible, hence the name of truly-floating-bitline scheme.

The test logic circuit 180 (FIG. 1) may include test circuits for measuring various characteristics, functions and performance of the memory arrays and memory cells by applying signals, voltages or currents to the memory array or memory cells for reading voltages, currents or signals from the memory arrays or memory cells. The test logic circuit 180 may include the test circuits described below in conjunction with FIGS. 4-10.

FIG. 4 is a schematic diagram illustrating a test circuit 400.

The test circuit 400 tests read and write voltages to the memory arrays. The test circuit 400 includes a node 402 that couples to a bit line, a word line, or a source line of the memory array 101, 102, 104 or 106. The test circuit 400 applies a voltage to the node 402 during a write mode or reads the voltage on the node 402 during a read mode. The test circuit 400 comprises a plurality of NMOS transistors 404 and 405. The transistor 404 operates as a switch to selectively couple an input node 410, which is coupled to an external pad (not shown), to the node 402 in response to a write signal applied to the gate thereof. The NMOS transistor 405 operates as a switch to selectively couple the node 402 to an output node 411, which is coupled to an external pad (not shown), in response to a read signal applied to the gate thereof. In one embodiment, the test circuit 400 is embedded in the local row decoders to write and read the word-lines (rows) and source lines directly.

In an alternative embodiment, the NMOS transistors 404 and 405 may include a plurality of series connected transistors to isolate further any noise from pads into the internal nodes. In another embodiment, the transistors 404 and 405 are PMOS transistors or full CMOS transistors.

FIG. 5 is a schematic diagram illustrating a test circuit 500.

The test circuit 500 tests at speed read and write voltages to the memory arrays. The test circuit 500 may perform a read using a source follower read to buffer the loading to enable at-speed testing. The test circuit 500 includes a node 502 that couples to a bit line, word line, or a source line of the memory array 101, 102, 104 or 106. The test circuit 500 applies a voltage to the node 502 during a write mode or reads the voltage on the node 502 during a read mode. The test circuit 500 comprises a plurality of NMOS transistors 504 and 505, a native NMOS transistor 506, and a load 507. The transistor 504 operates as a switch to selectively couple an input node 510 to the node 502 in response to a write signal applied to the gate thereof. The native NMOS transistor 506 is configured as a source follower on an output node 511, which is coupled to an external pad (not shown), in response to the transistor 505 operating as a switch to selectively couple the gate of the native NMOS transistor 506 to the node 502 in response to a read signal applied to the gate of the NMOS transistor 505. The voltage node coupled to the drain of the native NMOS transistor 506 may be coupled to a supply voltage VDD or a bias voltage. The load 507 is coupled between the output node 511, which is coupled to an external pad (not shown), and ground. The load 507 may be, for example, a resistor, a capacitor or a current load. In an alternative embodiment, the load 507 is external to the test circuit 500.

FIG. 6 is a schematic diagram illustrating a test circuit 600.

The test circuit 600 may test simultaneously read and write currents to the memory arrays at the same node or at different nodes. The test circuit 600 may measure currents on a node 602, which may be coupled to a circuit under test. The test circuit 600 may measure read currents or currents from other circuits, such as references from a bandgap reference. The test circuit 600 may provide received currents, such as current bias for voltage mode reads or current bias for source-side injection flash programming, to the memory. The test circuit 600 comprises a PMOS transistor 604 and a plurality of NMOS transistors 605 through 609. The PMOS transistor 604 and the diode connected NMOS transistor 609 provide a bias from an internal bias circuit on the node 602 in the event that a write signal is in a low state. The NMOS transistor 606 operates as a switch to selectively couple the node 602 to an output node 611, which couples to an external pad (not shown), in response to a read signal applied to the gate thereof to provide the current externally. The NMOS transistor 605 operates as a switch to selectively couple an input node 610 to the node 602 in response to the write signal applied to the gate thereof. In a read mode, the node 602 biases the NMOS transistor 608 which provides a current on the output node 611 in the event the NMOS transistor 606 is enabled by a read signal. The NMOS transistor 607 is biased by the node 602 to generate a bias current IBIAS for internal circuits. The test circuit 600 may be embedded in the segment bias circuits in the segment array to provide a local bias value for each segment.

FIG. 7 is a schematic diagram illustrating a test circuit 700.

The test circuit 700 may test simultaneously read and write timing signals from the memory and may test read and write timing of the memory byte introducing timing signals into the memory. The test circuit 700 includes a node 702 for coupling to the circuit under test. The test circuit 700 comprises a PMOS transistor 704, a plurality of NMOS transistors 705 and 706, and an inverter 707. The NMOS transistor 705 couples the node 702 to an output node 711 in response to a read signal for detecting timing signals from the memory. In a write test mode, the transistor 706 and the inverter 707 couple an input node 710 to the node 702 in response to a write signal. In a test mode, a timing signal is introduced to the circuit under test. The PMOS transistor 704 and the inverter 707 couple a timing node 712 to the node 702 in response to a low state of the write signal. The node 712 may be coupled to the oscillator 174 (FIG. 1).

FIG. 8 is a schematic diagram illustrating a test circuit 800.

The test circuit 800 may test simultaneously read and write voltages or read and write currents for reading and writing to source lines, word lines or bit lines. The test circuit 800 comprises a plurality of NMOS transistors 804 and 805 arranged in a similar manner as the NMOS transistors 404 and 405, respectively, of the test circuit 400 (FIG. 4). The test circuit 800 includes nodes 802, 810, and 811 that are arranged in a similar manner as the nodes 402, 410, and 411, respectively, of the test circuit 400. In this embodiment, the node 802 is coupled to a source line, word line, or bit line of the memory, and the write enable and read enable signals for source lines, word lines and bit lines are applied to the respective NMOS transistor 804 and 805.

The test circuit 800 may be embedded in a decoder, such as the decoders 130, 134, 150, 154, or 156 to provide a bias value at a test node. In a large chip, the test circuit 800 provides a more meaningful test because of large variations across the chip or because of operating conditions across the chip.

Figure 9:
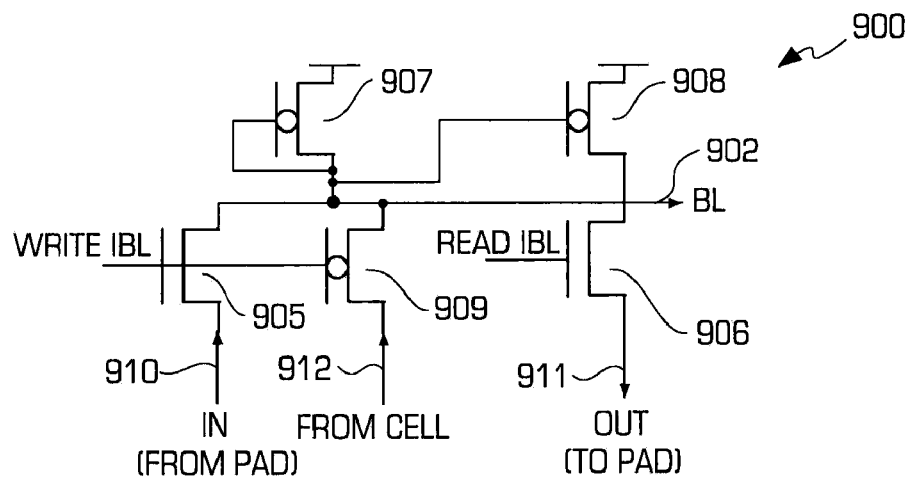
FIG. 9 is a schematic diagram illustrating a sixth embodiment of a test circuit.

FIG. 9 is a schematic diagram illustrating a test circuit 900.

A test circuit 900 comprises a plurality of NMOS transistors 905 and 906 and a plurality of PMOS transistors 907, 908 and 909. The test circuit 900 may apply a read or write bitline current in real time, such as cell current, or measure bitline leakage current, such as leakage calibration from chips or junctions, or over operating conditions. The write current may be used as an external reference current for sensing. The write current also may be used as a data cell current to check sensing circuitry speed and sensitivity. The PMOS transistor 909 selectively couples a node 912, which is coupled to a data or reference cell, to a bitline node 902, which may be coupled to a bitline in a memory array. The NMOS transistor 905 selectively couples an input node 910 to the bitline node 902 in response to a write bitline current signal applied to the gate thereof. The diode connected PMOS transistor 907 provides a load on the bitline node 902. The series connected PMOS transistor 908 and the NMOS transistor 906 form a current mirror with the diode connected PMOS transistor 907 to detect bitline current mirrored on to a output node 911 in response to a read bitline current signal applied to the gate of the NMOS transistor 906. The test circuit 900 may measure cell current in the real time under real read conditions. The test circuit 900 also may measure bitline leakage or coupling in real time.

Figure 10:
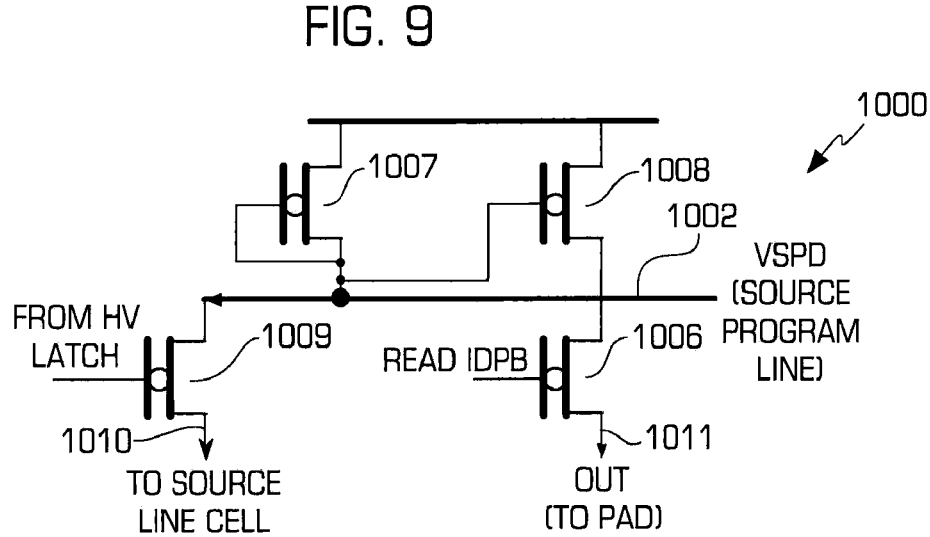
FIG. 10 is a schematic diagram illustrating a seventh embodiment of a test circuit.

FIG. 10 is a schematic diagram illustrating a test circuit 1000.

The test circuit 1000 is a high voltage test circuit that may be used for measuring real time programming current that may include DC bias current and AC coupling current. The test circuit 1000 comprises a plurality of PMOS transistors 1007, 1008, 1009 and 1011 that are arranged in a similar manner as the PMOS transistors 907, 908 and 909 and the NMOS transistor 906, respectively, of the test circuit 900 (FIG. 9). The drain of the PMOS transistor 1007 and the source of the PMOS transistor 1008 are coupled to a node 1002, which may be coupled to a source program line. The sources of the PMOS transistors 1007 and 1008 are coupled to a high voltage supply line, which may be coupled to a high voltage test pad (not shown). The PMOS transistors 1007, 1008, 1009 and 1006 may be high voltage PMOS transistors. The PMOS transistor 1009 selectively couples a source line cell node 1010 to the source program line node 1002 in response to a signal from a high voltage latch. The PMOS transistor 1006 is enabled to couple an output node 1011 to the drain of the PMOS transistor 1008, which mirrors the current on the diode connected PMOS transistor 1007, in the event that a READ IDPB signal enables the PMOS transistor 1006. The node 1002 may be buffered by an NMOS transistor operating as a source follower.

A test circuit 1000 may be used to measure the multiplication factor (M-Factor) of the source-side injection flash memory cells. The M-Factor is the ratio of high voltage supply current to the programming bias current. The M-Factor typically is in the range of 2 to 4. For example, for a 100 nA programming current, the high voltage supply provides a current in the range of 200 to 400 nA. Ideally, the M-Factor equals 1, meaning that all the supply current is used for programming. However, the wasted current is due to carriers not having sufficient energy to traverse energy barriers at the silicon and silicon dioxide interface and not having favorable location (e.g., close to the interface), and direction (e.g., pointing to the interface). A more accurate M-Factor allows a more accurate design of high voltage supply currents to optimize area and power. In one embodiment of measuring the M-factor, a source programming voltage VSPD-IN is applied on the sources of the PMOS transistors 1007 and 1008 and at the same time the source programming voltage VSPD is read on the node 1002 from a source line cell coupled to the transistor 1010 by enabling the PMOS transistor 1006 and reading the voltage of the output node 1011. The voltage VSPD-IN is applied until the read voltage VSPD equals a desired value, and then the current ISP is read. The multiplication factor M equals the ratio of the current IDP (read through the transistor 1006) and the bitline current ISP. The current ISP is the programming bias current applied to the bitline that may be read from a read ISP measurement. The M-factor versus the voltage level or versus temperature may be stored in a non-volatile lookup table (not shown) that can be used by the chip controller logic 180 to compensate accordingly.

In another embodiment for determining the M-factor, the voltage is forced in a write-VSPD mode and the IDP current is measured at the same time, for example, by a voltage drop across a resistor in series on the VSPD line.

Figure 11:
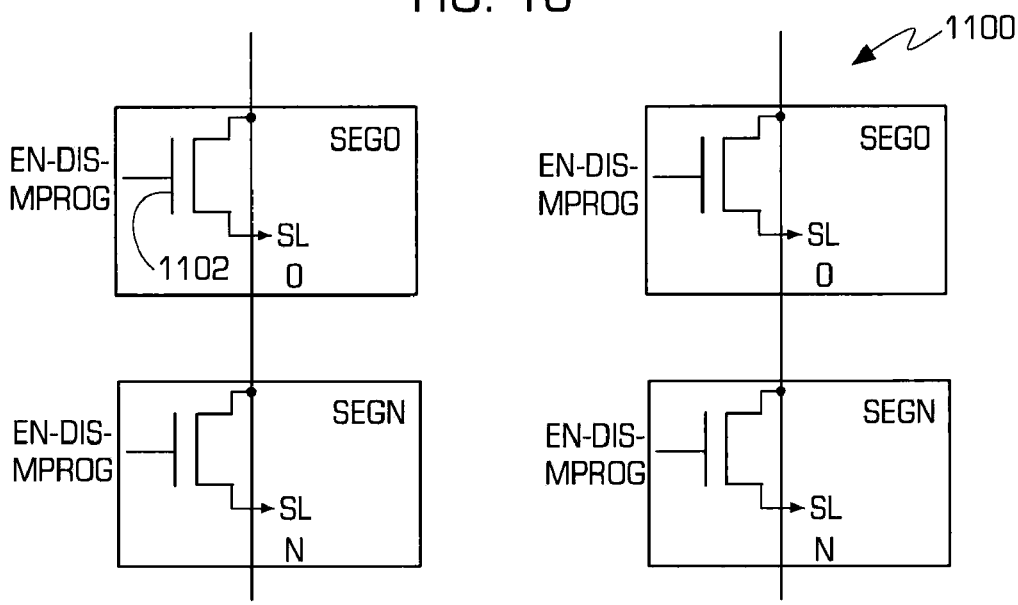
FIG. 11 is a block diagram illustrating a segmented memory system having distributed mass programming.

FIG. 11 is a block diagram illustrating a segmented memory system 1100 having distributed mass programming.

The segmented memory system 1100 comprises a plurality of segments SEG0 through SEGN, such as those described above in conjunction with FIG. 2. A segment comprises a transistor 1102 that when enabled by an enable distributed mass programming signal couples a source line to a supply line for programming the memory cells. In a distributed mass programming mode, cells in different segments are enabled to distribute the current across decoding and current bias circuitry. During a distributed mass programming mode, the test circuits described above in conjunction with FIGS. 4-10 may be used to measure programming currents or cell currents. In the event that a measured current indicates a failure of a memory cell or incorrect programming, individual segments may be enabled and memory cells may be tested.

Figure 12:
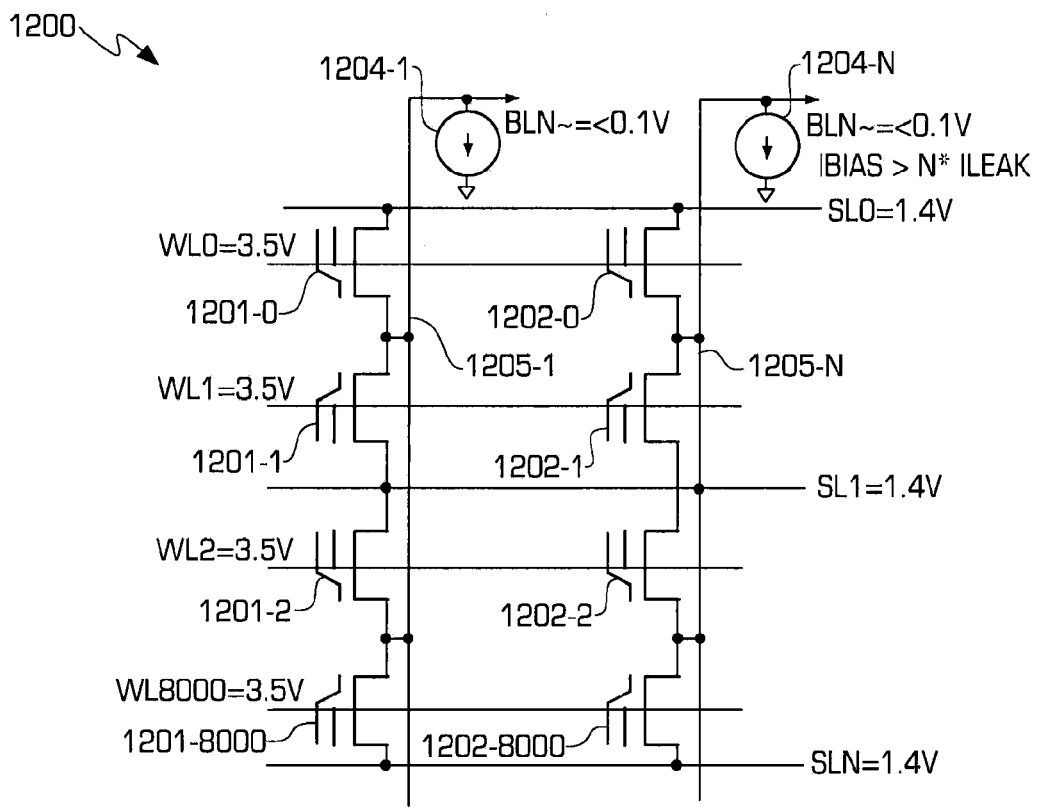
FIG. 12 is a block diagram illustrating a segmented memory system having distributed mass reading.

FIG. 12 is a block diagram illustrating a segmented memory system 1200 having distributed mass reading.

The segmented memory system 1200 comprises a plurality of memory cells 1201-0 through 1201-8000 and 1202-0 through 1202-8000 and a plurality of current sources 1204-1 through 1204-N. The memory cells 1201 are coupled to a bitline 1205-1, which is coupled to the current source 1204-1. Similarly the memory cells 1202 are coupled to a bitline 1205-N which is coupled to the current source 1204-N. The memory cells 1201 and 1202 are coupled to corresponding word lines WL and source lines SL. The current on the bitlines 1205 is detected to determine whether or not the bias current of the memory cells 1201 and 1202 in the segment is greater than the leakage current. Specifically, it is determined whether the bias current IBIAS is greater than the number of bitlines N times the leakage current ILEAK.

After the memory cells 1201 and 1202 are programmed, the memory cells 1201 and 1202 are presumed to be off. The cells 1201 and 1202 are placed in a voltage sensing mode and the bitline voltage should be approximately zero if all cells are off along the bitline. If the memory is bad, such as at least one cell is on resulting in the bitline voltage being significantly greater than zero, a method of multiple successive binary search reads (successive dividing the array into half) are done in the segment to determine which of the memory cells 1201 and 1202 are defective.

Figure 13A:
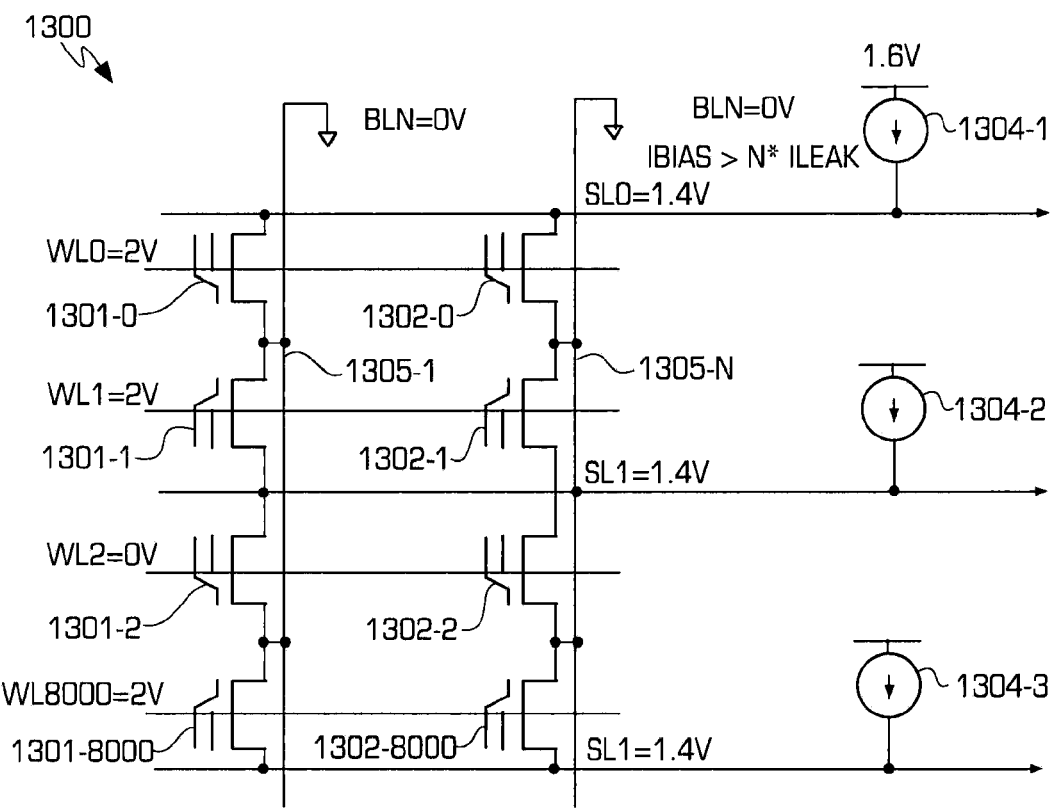
FIG. 13A is a block diagram illustrating a segmented memory array having distributed mass reading in a second embodiment.

FIG. 13A is a block diagram illustrating a segmented memory array 1800 having distributed mass reading in a second embodiment.

The segmented memory array 1800 comprises a plurality of memory cells 1801-0 through 1801-8000 and 1802-0 through 1802-8000, and a plurality of current sources 1804-1 through 1804-8000. The memory cells 1801 are coupled to a bitline 1805-1, which is coupled to ground. Similarly, the memory cells 1802 are coupled to a bitline 1805-1, which is coupled to ground. The current source 1804 biases a corresponding source line. The current source 1804 provides a bias such that the bias is greater than N number of memory cells (e.g., 8000) times the leakage current.

After the memory cells 1801 and 1802 are programmed, the memory cells 1801 and 1802 are presumed to be off. The cells 1801 and 1802 are placed in voltage sensing mode in the bitline voltage should be approximately zero if all cells are off on the bitline. If the memory is bad, such as at least one cell is on, this results in the bias current being higher than the product of the number of memory cells N times the leakage current. In this case, multiple successive binary search reads are performed in a segment to determine which of the memory cells 1801 and 1802 are defective.

Figure 13B:
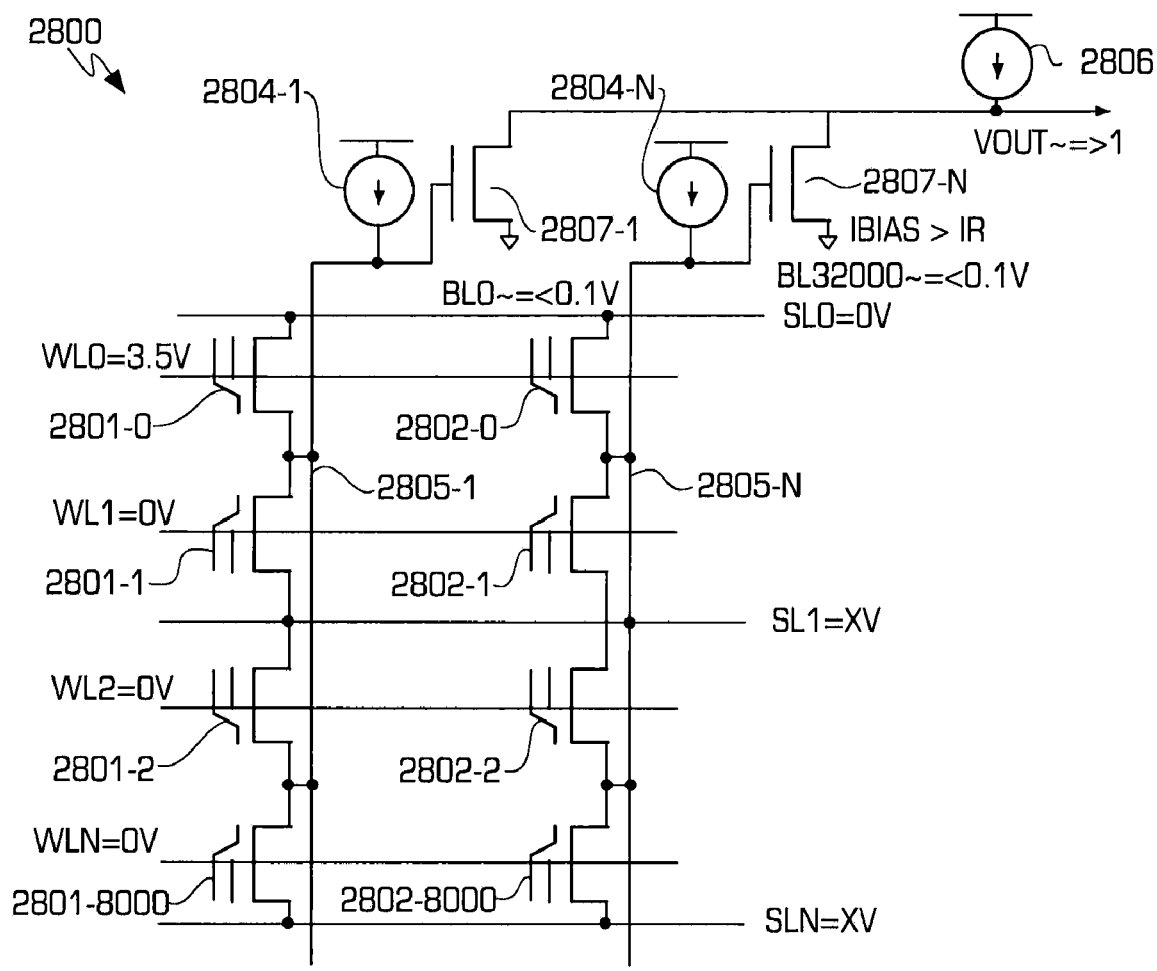
FIG. 13B is a block diagram illustrating a segmented memory array having distributed mass reading in a third embodiment.

FIG. 13B is a block diagram illustrating a segmented memory system 2800 having distributed mass reading in a third embodiment.

The segmented memory array 2800 comprises a plurality of memory cells 2801-0 through 2801-8000 and 2802-0 through 2802-8000, a plurality of current sources 2804-1 through 2804-N, a current source 2806, and a plurality of NMOS transistors 2807-1 through 2807-N. The memory cells 2801 are coupled to a bitline 2805-1, which is coupled to the current source 2804-1 and to the gate of the NMOS transistor 2807-1. Similarly, the memory cells 2802 are coupled to a bitline 2805-N which is coupled to the current source 2804-N and to the gate of the NMOS transistor 2807-N. The current source 2806 biases the drain of the NMOS transistors 2807 to provide an output voltage VOUT in response to the sum of the biasing on the gates of the NMOS transistors 2807 from the corresponding current source 2804 and the memory cells 2801 and 2802.

After the memory cells 2801 and 2802 are erased, the memory cells 2801 and 2802 should be on. The cells 2801 and 2802 are placed in a current sensing mode and a row is read. The corresponding bitline 2805 should be pulled low, so that the output voltage VOUT is high. If any of the cells 2801 or 2802 are off, the bitline 2805 is pulled high and the corresponding output voltage VOUT is low. In the latter case, the memory is bad and multiple successive binary search reads are done in the segment to determine which of the memory cells 2801 and 2802 are defective.

Figure 14:
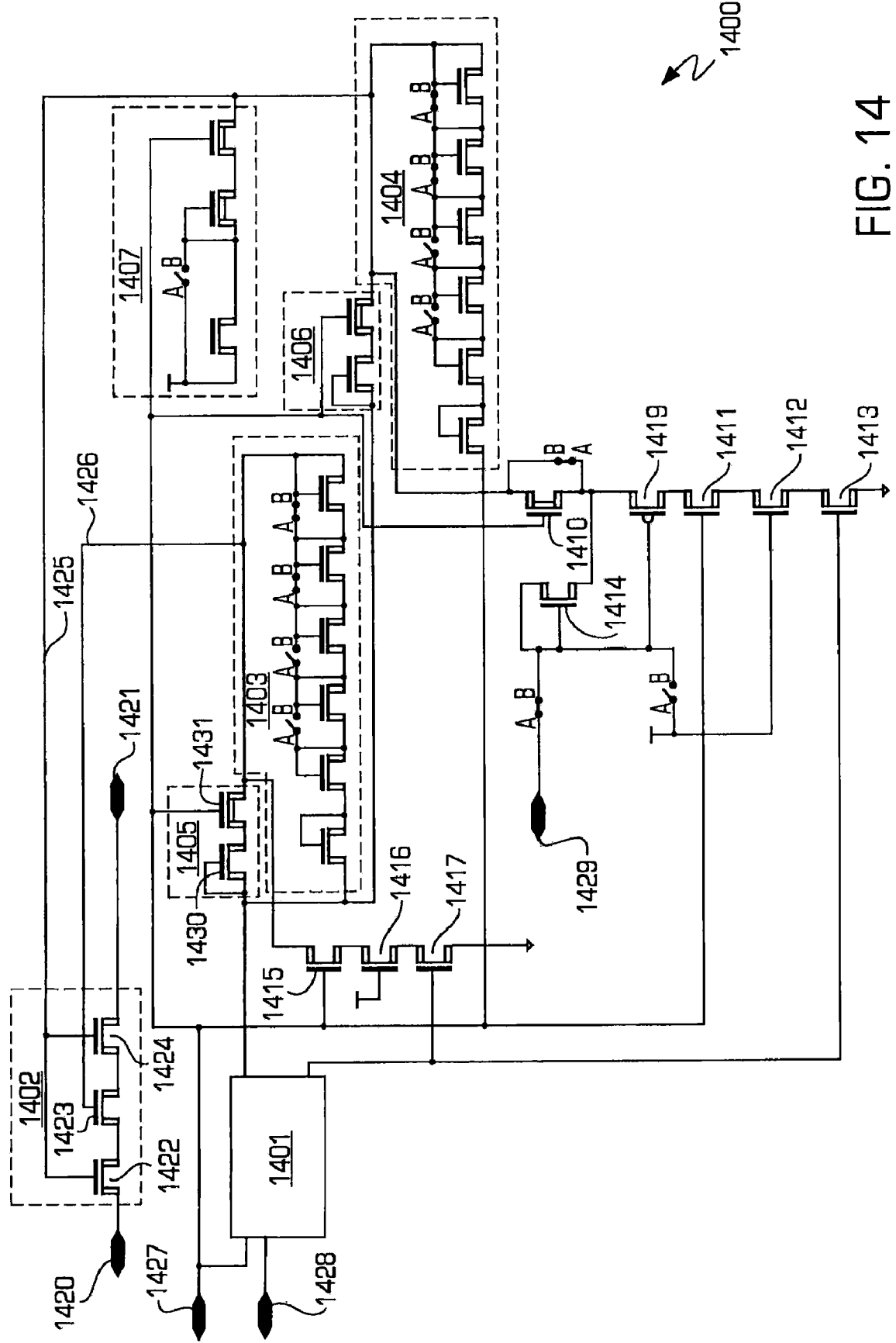
FIG. 14 is a schematic diagram illustrating a high voltage test transceiver.

FIG. 14 is a schematic diagram illustrating a very high voltage test transceiver 1400.

The very high voltage test transceiver 1400 comprises a high or medium voltage level shift circuit 1401, and a plurality of transmission gates 1402, 1405, 1406 and 1407, a plurality of diode clamp circuits 1403 and 1404, a plurality of NMOS transistors 1410 through 1417, and a PMOS transistor 1413. The diode clamp circuits 1403 and 1404 may include a number of optional diode connections to select the number of diodes in the clamp circuit. The transmission gate 1402 may be a self boosted double high voltage buffering circuit. The transmission gate 1402 couples a test node 1420 to a transmission node 1421, which may be coupled to a portion of the system 100 that is being tested. The transmission gate 1402 comprises a plurality of NMOS transistors 1422 through 1424 that include drain-source terminals coupled in series between the nodes 1420 and 1421. In one embodiment, the NMOS transistors 1422 through 1424 are high voltage NMOS transistors. The NMOS transistors 1422 and 1424 are enabled by an enable signal 1425, and the NMOS transistor 1423 is enabled by a enable signal 1426. The level shift circuit 1401, the transmission gates 1403 through 1407, the NMOS transistors 1410 through 1417, and the PMOS transistor 1429 form an enable circuit for the transmission gate 1402.

A signal 1427 may be a high or medium voltage supply (e.g., 8-10 volts) that is used to buffer a very high voltage (e.g., greater than 13 volts) such as on a very high voltage node 1425, through the NMOS transmission gate 1402, NMOS transistor 1415 and NMOS transistor 1411, and a very high voltage node 1426 through an NMOS transistor 1431 in the transmission gate 1406. The signal 1427 may also be used to clamp the voltage on the node 1425 to be the voltage at the node 1427 plus the NMOS threshold voltages through the diode clamp circuit 1404 (e.g., 4 NMOS threshold voltages vt). The signal 1427 may also be used to clamp the voltage at the node 1426 (when the circuit 1401 is enabled by the signal 1428) to be at the voltage at the node 1427 plus the threshold voltages through diode clamp circuit 1403 (e.g., 4 NMOS threshold voltages vt). The circuits 1405 and 1406 may be used to pre-charge the nodes 1426 and 1425, respectively, to an intermediate voltage (e.g., the voltage on the node 1427 minus 1 NMOS voltage threshold vt) when the circuit 1401 is enabled by the signal 1428.

The signal 1429 may be used to clamp the source of the NMOS transistor 1414 or the source of the PMOS transistor 1419 to be equal to or greater than the voltage of the signal 1429 minus 1 NMOS voltage threshold vt or the voltage of signal 1429 plus 1 PMOS voltage threshold vt. The NMOS transistors 1416 and 1411 may be used to further buffer by another intermediate voltage (e.g., VDD). The NMOS transistors 1417 and 1413 may be used to discharge the drain of the NMOS transistor 1415 to ground and the source of the PMOS transistor 1419 to the voltage of the signal 1429 plus 1 PMOS voltage threshold vt, respectfully, when the circuit 1401 is disabled by the signal 1428.

The circuit 1407 may be used to hold the node 1425 at the supply voltage VDD minus 2 NMOS voltage thresholds vt.

The circuit 1407 operates as follows. First, the signal 1428 is enabled to pre-charge the nodes 1425 and 1426 to the voltage of the node 1427 minus 1 NMOS voltage threshold vt (e.g., 10 volts-1 volt=9 volts), through the circuits 1401, 1405 and 1406. The supply voltage now is applied at the node 1420 (e.g., 0 volts to 13 volts). As the node 1420 goes from 0 volts to 13 volts, for example, the gate capacitances of the NMOS transistors 1422, 1423 and 1424 act as bootstrapping capacitances to boost the nodes 1425 and 1426 up to approximately 16-18 volts that allows the 13 volts to fully pass through. The final boosted voltage on the nodes 1425 and 1426 depends on the ratio of the gate capacitances of the NMOS transistors 1422, 1423 and 1424 to the loading of the nodes 1425 and 1426. The final boosted voltage may also be clamped by the diode clamp circuit 1404 and 1403 as explained above. Now if the signal 1428 is disabled, the node 1426 is pulled down to ground through the NMOS transistors 1415 through 1417, meanwhile the node 1525 is pulled down to the voltage of the node 1429 plus 1 PMOS voltage threshold vt (e.g., 8 volts), through the transistors 1419 and 1411 through 1413. Thus, with the gates of the NMOS transistors 1424 and 1422 being in an intermediate voltage, the very high voltage (e.g., 13 volts) at the nodes 1420 and 1421 does not break down the NMOS transistors 1422, 1423 or 1424.

Accordingly, the circuit 1402 may be a self-boosted double buffering circuit. The nodes 1427 and 1428 are supplied by intermediate voltages from internal circuits or from pads. The node 1428 is a test control logic signal. In another embodiment, the transceiver 1400 may be self-powered, with all the supplies to the transceiver being supplied by the node 1420. In this case, the node 1420 is applied with double pulses. A first pulse from, for example, 0 volts to 10 volts, supplies the circuit 1401 and control circuitry to pre-charge the nodes 1425 and 1426 as above. Then the node 1420 goes from 10 volts to 0 volts. As the node 1420 goes from 10 volts to 0 volts, the nodes 1425 and 1426 still retain the charge on them to keep them at an intermediate voltage. Now a second pulse from 0 volts to 13 volts is applied to the node 1420 and the operation works as before.

Figure 15:
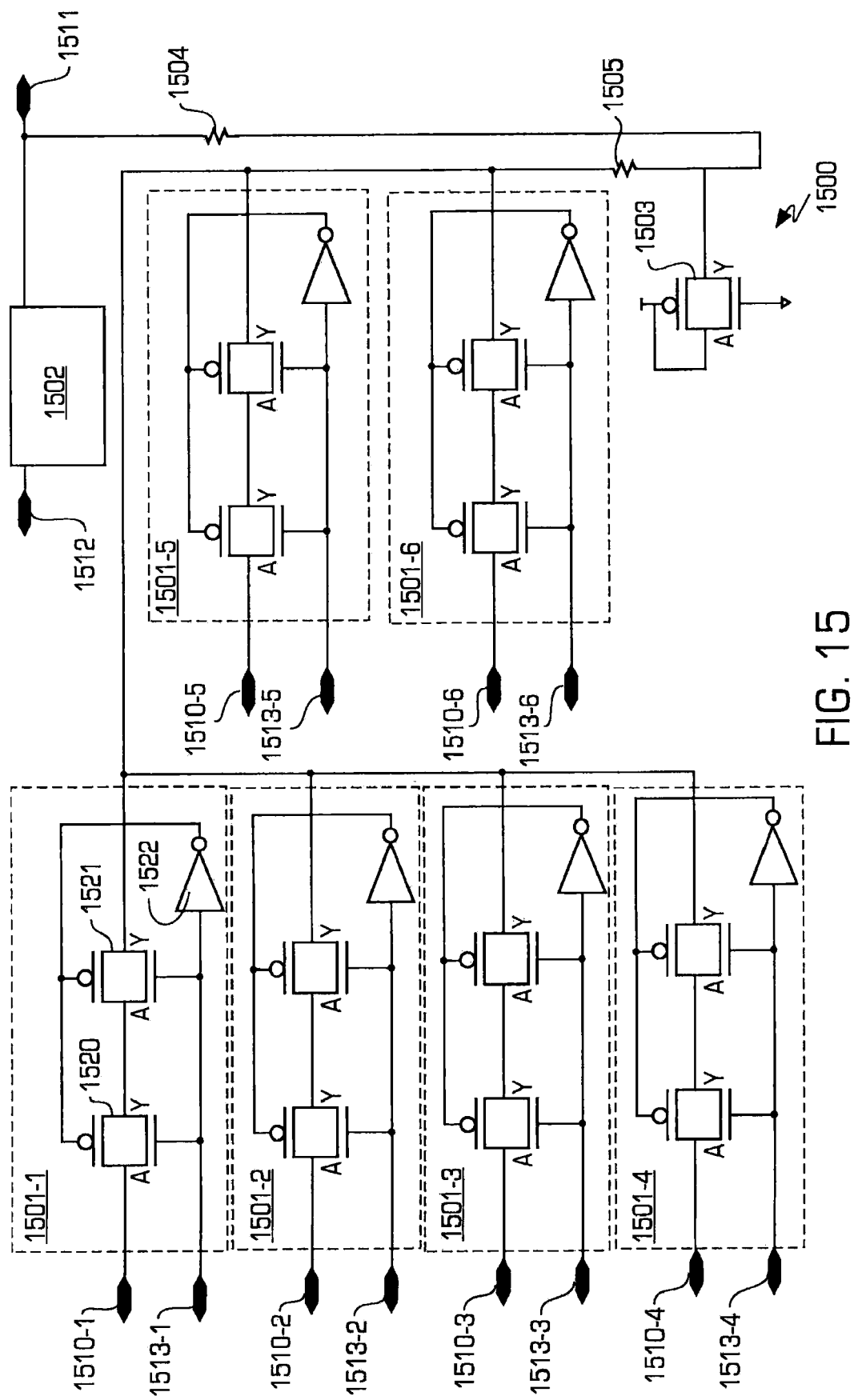
FIG. 15 is a schematic diagram illustrating a low voltage test transceiver.

FIG. 15 is a schematic diagram illustrating a low voltage test transceiver 1500.

The low voltage test transceiver 1500 may be used, for example, to test the current or voltage bias of portions of the memory system. The low voltage test transceiver 1500 may be less sensitive to coupling from external stimuli. The low voltage test transceiver 1500 uses multiple series cascoding to limit coupling from an input node 1510 to an output node 1511. The multiple series cascoding of the transistors represents multiple parasitic bipolar in series, and hence, is less susceptible to voltage swings at the pad. The low voltage test transceiver 1500 comprises a plurality of transmission gates 1501-1 through 1501-6, a circuit 1502, a transmission gate 1503, and a plurality of resistors 1504 and 1505. The circuit 1502 is a pad structure with ESD protection, similar to FIG. 16 but with single ESD primary protection for low voltage. The transmission gates 1501 each comprise a plurality of transmission gates 1520 and 1521 and an inverter 1522. For simplicity and clarity, only one transmission gate 1501 shows reference numbers for the elements 1520 through 1522. The transceiver 1500 may include other numbers of transmission gates 1501. Each transmission gate 1501 couples a corresponding input node 1510 to the node 1511 in response to an enable signal 1513. The circuit 1502 couples a pad 1512 to the pad 1511. The resistors 1404 and 1405 may be used as current limiting resistors to the limit the current from coupling or ESD event at the pad 1512. The single transmission gate 1503 through its parasitic bipolar may be used to provide current to the coupling event at the pad 1512. This reduces the coupling getting through the cascoding gates 1520 and 1521 to the internal node 1510.

Figure 16:
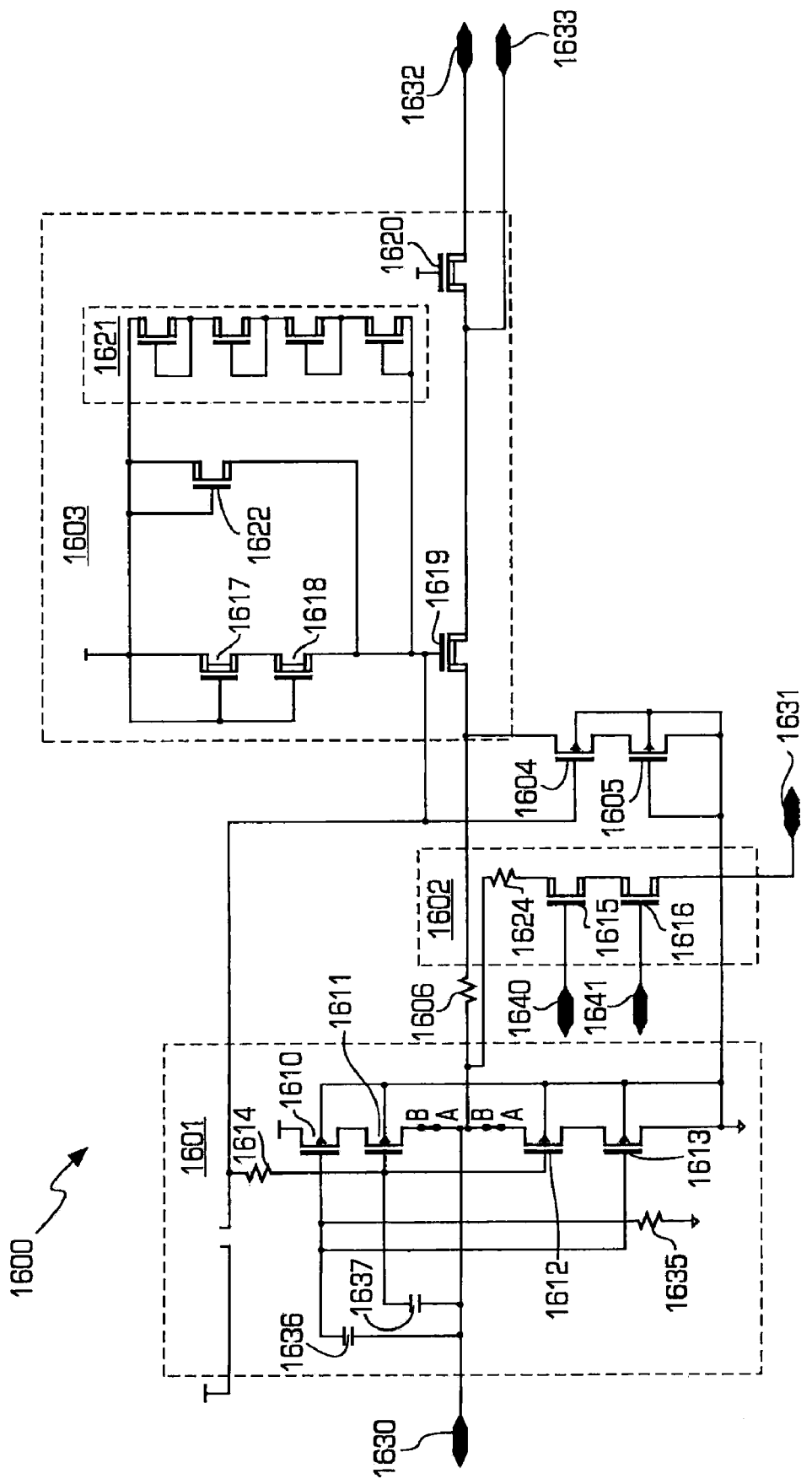
FIG. 16 is a schematic diagram illustrating a test pad transceiver.

FIG. 16 is a schematic diagram illustrating a test pad transceiver 1600.

The test pad transceiver 1600 comprises a primary electrostatic discharge (ESD) protection circuit 1601, a transmission gate 1602, a boost circuit 1603, a plurality of NMOS transistors 1604 and 1605, and a current limiting resistor 1606. The primary ESD protection circuit 1601 provides electrostatic discharge protection from the node 1630. The primary ESD protection circuit 1601 comprises a plurality of NMOS transistors 1610 through 1613 arranged in a cascode configuration to provide protection against breakdown of high voltages applied to the transistors. The primary ESD protection circuit 1601 further comprises a resistor 1614 to help turn on the transistors 1611 and 1612 in an ESD event. An ESD event at the pad 1630 couples gates of the transistors 1611, 1612 through this source-gate capacitance to a voltage. This voltage helps to turn on the NMOS transistors 1611 and 1612 earlier to sink the current to start the NPN action through source-substrate-drain. The resistor 1614 and this capacitance are typically in hundreds of nanoseconds to microseconds to not effect the normal operation. Additional capacitance may be added. Similarly, a resistor 1635 together with the gate-drain capacitance of the NMOS transistors 1610 and 1613 behave similarly in an ESD event. The resistor 1636 and the capacitors 1636 and 1637 couple the pad 1630 to the gates of the NMOS transistors 1610 and 1613 and ground. The transmission gate 1602 couples the node 1630 and a node 1631 through the NMOS transistors 1615 and 1616 in response to enable signals 1640 and 1641, respectively. The resistor 1624 limits the current flow through the NMOS transistors 1615 and 1616 in an ESD event. The resistance of the resistor 1624 may be less than that of the resistor 1606 to minimize the voltage drop when the transceiver 1602 is enabled and large enough to resist ESD current. The boost circuit 1603 comprises pass NMOS transistors 1619 and 1620 between the node 1632 and the node 1630 via the current limiting resistor 1606. The NMOS transistor 1619 acts as a self-boosting transistor using its gate capacitance as a boosting capacitance. The boost circuit 1603 further comprises high voltage NMOS transistors 1617, 1618 and 1622 to precharge the gate of the NMOS transistor 1619 and a diode connected transistor chain 1621 coupled to provide a clamped voltage on the gate of the NMOS transistor 1619. In one embodiment, the NMOS transistors 1617 through 1622 are high voltage NMOS transistors. Because the boost circuit 1603 is self-boosting, the speed penalty is minimal. In NMOS transistors 1604 and 1605 and the resistor 1606 provides secondary ESD protection for the test transceiver. In an alternative embodiment, the gates of the NMOS transistors 1604 and 1609 are not coupled to each other.

Figure 17:
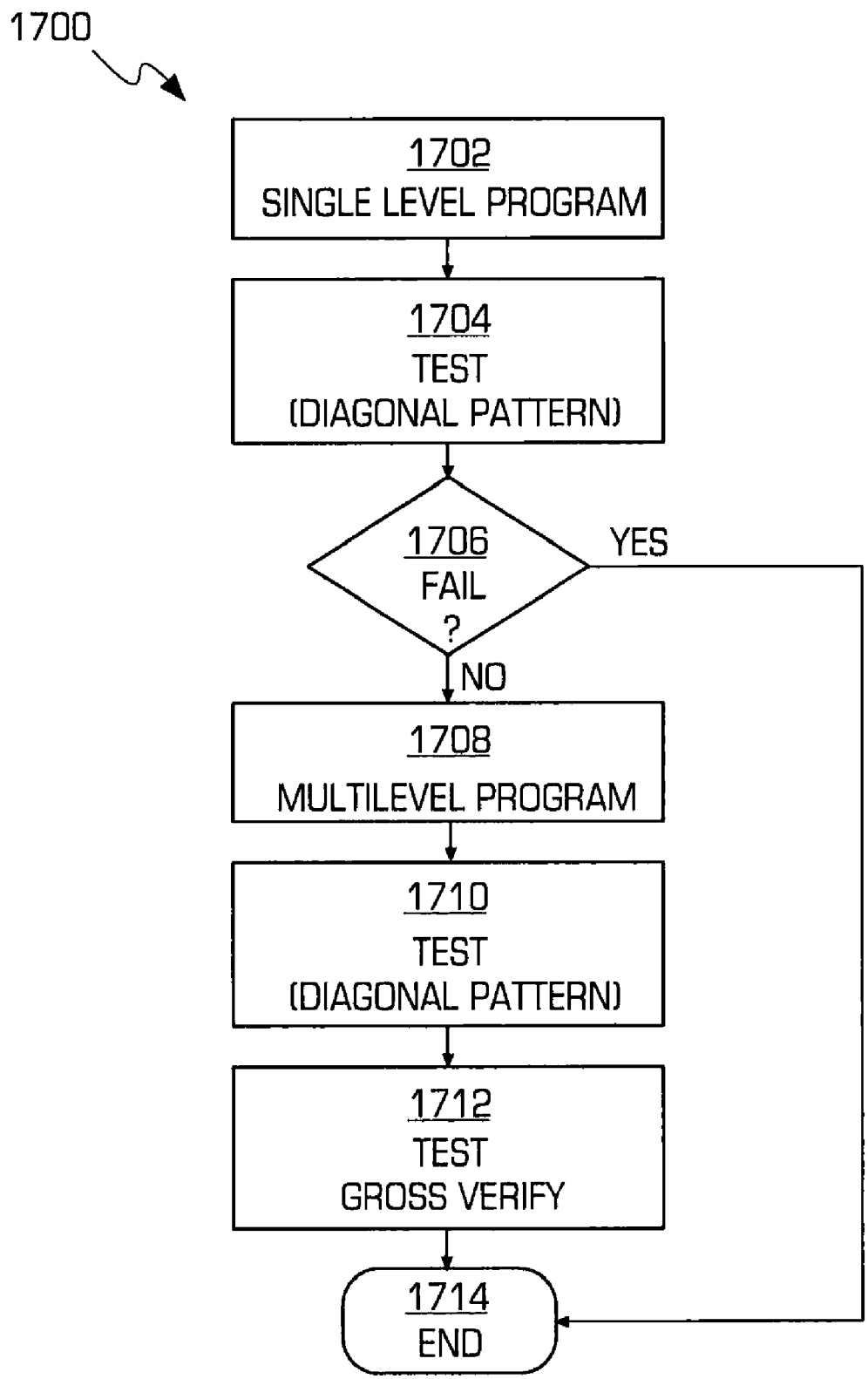
FIG. 17 is a flowchart illustrating a test process of a multilevel memory system.

FIG. 17 is a flowchart illustrating a test process of a multilevel memory.

The test process of FIG. 17 tests a multilevel memory by first programming the memory as a single level memory and testing using a simpler and faster initial test. If this test is successful, the memory is programmed as a multilevel memory cell and various testing is performed. For example, a cell has a voltage threshold window of 2 volts between erased and programmed states. Single level memory cells have two levels, level 0 has a threshold voltage from 0V to 1V (may correspond to digital data 0) and level 1 has a threshold voltage from 1V to 2V (may correspond to digital data 1). Multilevel level memory cells of 2 bits per cell has 4 levels: level 0 has a threshold voltage from 0V to 0.5V (may correspond to digital data 00), level 1 has a threshold voltage from 0.5V to 1V (may correspond to digital data 01), level 2 has a threshold voltage from 1V to 1.5V (may correspond to digital data 10), and level 3 has a threshold voltage from 1V to 2V (may correspond to digital data 11). Margin to refers to a +/−delta voltage variation that a level voltage is allowed to have without impacting performance. For example, for a single level cell, margin may be around 0.5V and for a 2-bit multilevel cell, margin may be 0.25V. A margin is use to take care of various requirements such as cell data retention, endurance, or sensing error.

The memory is programmed with a single level using a single pulse to speed up programming. (block 1702). This single level programming may be used, for example, for initial screening or address decoding check. A single level test is performed (block 1704). The single level test may be, for example, a diagonal pattern self checking with program and verify to check for address scrambling. The diagonal pattern may be one or zero. If the single level test (block 1704) fails (block 1706), the memory may be considered defective and the test is ended (block 1714).

Otherwise, if the test passes (block 1706), the memory cells are programmed using a multilevel program (block 1708). A multilevel test is then performed (block 1710). The multilevel test may be, for example, a multilevel diagonal pattern with program and verify during self checking. This programming tests address scrambling and multilevel operation across the chip. A gross verify test is performed (block 1712). The gross verify may be done to speed up sensing. In one embodiment, the gross verify includes testing a larger margin, such as checking a middle level margin.

In another embodiment, after the single level programming (block 1702) is performed, a multilevel evaluation (block 1710) is performed to check for programmed memory cells such as for multilevel cell voltage or current window (range) and margin. Then the test flow follows as previously.

In another embodiment, after the multilevel programming (block 1708) is performed, a single level evaluation (block 1704) is performed to check for programmed memory cells such as to speed up the evaluation while still checking for cell voltage or current window and margin. Then the test flow follows as previously.

Figure 18:
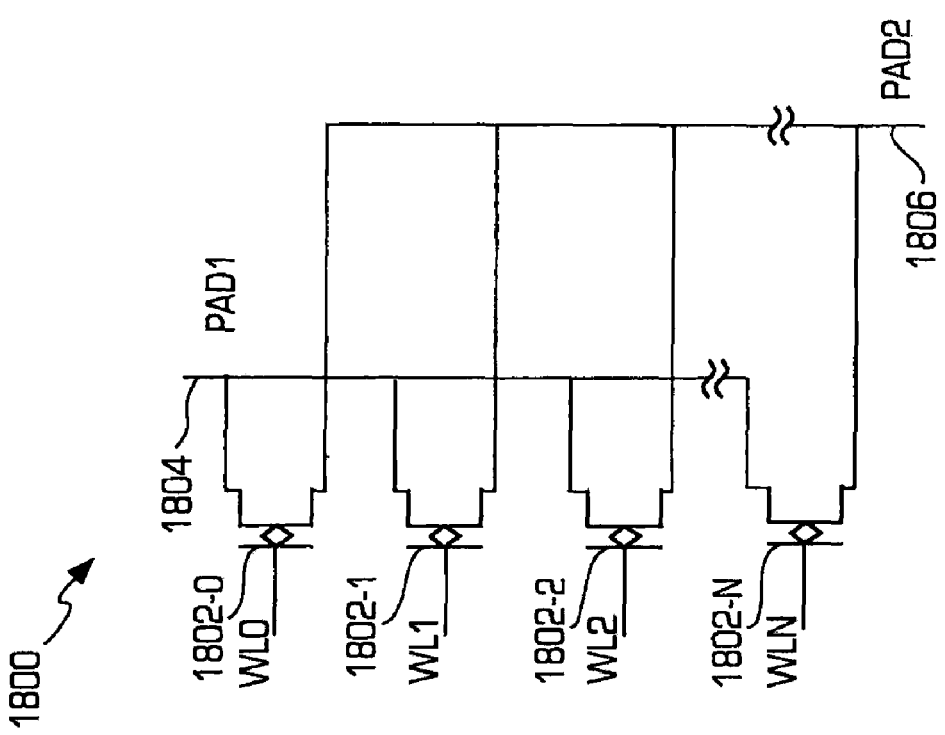
FIG. 18 is a schematic diagram illustrating a first embodiment of a test circuit for testing a plurality of memory cells.

FIG. 18 is a schematic diagram illustrating a test circuit 1800.

The test circuit 1800 comprises a plurality of NMOS transistors 1802-0 through 1802-N. The drain of each of the NMOS transistors 1802-0 through 1802-N are coupled to a pad 1804. The source of each of the NMOS transistors 1802-0 through 1802-N are coupled to a second pad 1806. Word lines WL0 through WLN are coupled to a gate of a respective NMOS transistor 1802-0 through 1802-N. The test circuit 1800 operates as a "winner-take-all" monitor. Any word line that is on controls the coupling of the first pad 1804 to the second pad 1806. As an illustrative example, the zero word line WL0 is set at 10 volts, the first word line WL1 is set to 5 volts and the remainder of the word lines WL2 through WLN are set to zero volts. The output on the second pad 1806 is the voltage of the highest voltage on one of the word lines less the threshold voltage of the transistor. In this illustrative example, the voltage on the pad 1806 is 10 volts minus VTZ (threshold voltage of the NZ transistor 1802) or approximately 10 volts.

In alternative embodiments, source lines or bit lines may be coupled to the gates of the NMOS transistors 1802. The test circuit 1800 does not use decoding for selection of the monitoring of the test pads.

Figure 19:
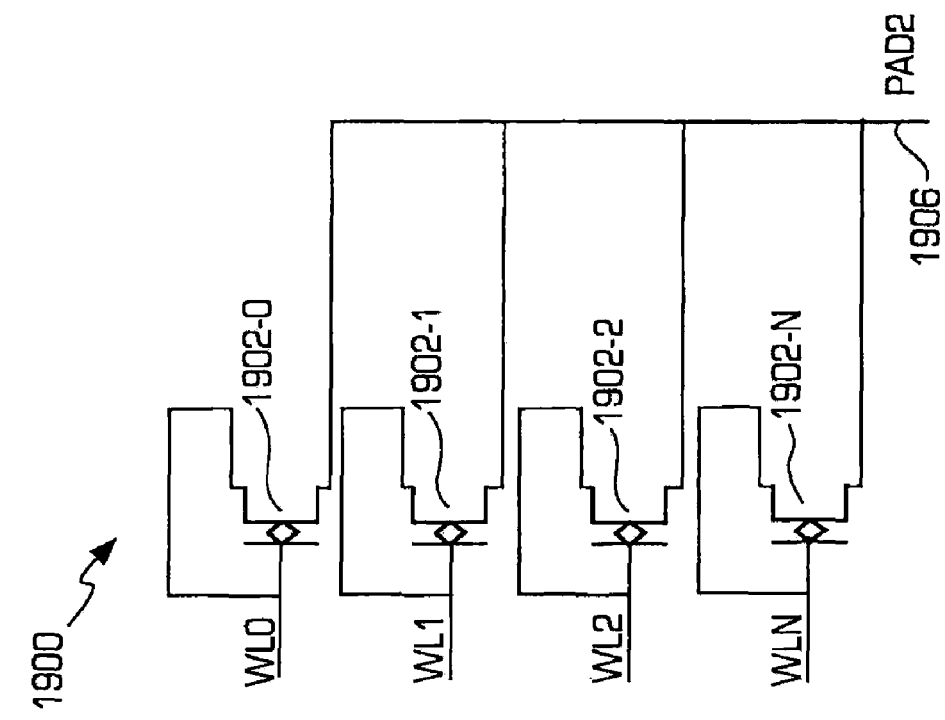
FIG. 19 is a schematic diagram illustrating a second embodiment of a test circuit for testing a plurality of memory cells.

FIG. 19 is a schematic diagram illustrating a test circuit 1900.

The test circuit 1900 comprises a plurality of NMOS transistors 1902-0 through 1902-N. Each transistor 1902 is diode connected with a gate coupled to a corresponding word line. The source of each NMOS transistor 1902 is coupled to a test pad 1906. In another embodiment, the NMOS transistors 1902 may be NZ transistors. Unlike the test circuit 1800, the test circuit 1900 has only one test pad. Word lines WL0 through WLN are coupled to a gate of a respective NMOS transistor 1902-0 through 1902-N. The test circuit 1900 operates as a "winner-take-all" monitor. Any word line that is on controls the coupling of the pad 1906. As an illustrative example, the zero word line WL0 is set at 10 volts, the first word line WL1 is set to 5 volts and the remainder of the word lines WL2 through WLN are set to zero volts. The output on the pad 1906 is the voltage of the highest voltage on one of the word lines less the threshold voltage of the transistor. In this illustrative example, the voltage on the pad 1906 is 10 volts minus VTZ (threshold voltage of the NZ transistor 1902) or approximately 10 volts.

In alternative embodiments, source lines or bit lines may be coupled to the gates of the NMOS transistors 1902. The test circuit 1900 does not use decoding for selection of the monitoring of the test pads.

Figure 20:
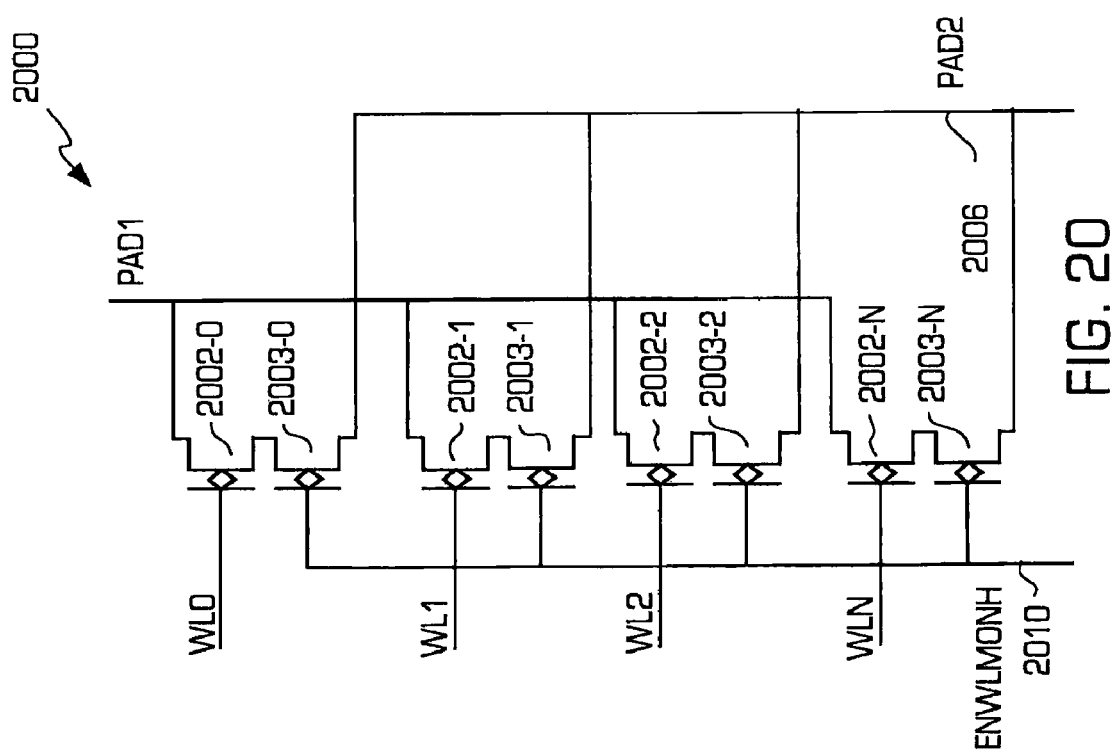
FIG. 20 is a schematic diagram illustrating a third embodiment of a test circuit for testing a plurality of memory cells.

FIG. 20 is a schematic diagram illustrating a test circuit 2000.

The test circuit 2000 comprises a plurality of NMOS transistors 2002-0 through 2000-N and a plurality of NMOS transistors 2003-0 through 2003-N. Each NMOS transistor 2003-0 through 2003-N includes a gate coupled to an enable signal (ENWLMONH) and is coupled with a corresponding NMOS transistor 2002-0 through 2002-N between a first pad 2004 and a second pad 2006. A corresponding word line WL0 through WLN is coupled to the gate of a respective NMOS transistor 2002-0 through 2002-N. The enable signal 2010 enables the NMOS transistors 2003 so that the NMOS transistors 2002 can function as a "winner-take-all" circuit. The NMOS transistors 2003 isolate the word lines when not in the test node. Any word line that is on controls the coupling of the first pad 2004 to the second pad 2006. As an illustrative example, the zero word line WL0 is set at 10 volts, the first word line WL1 is set to 5 volts and the remainder of the word lines WL2 through WLN are set to zero volts. The output on the second pad 2006 is the voltage of the highest voltage on one of the word lines less the threshold voltage of the transistor. In this illustrative example, the voltage on the pad 2006 is 10 volts minus VTZ (threshold voltage of the NZ transistor 2002) or approximately 10 volts.

In alternative embodiments, source lines or bit lines may be coupled to the gates of the NMOS transistors 2002. The test circuit 2000 does not use decoding for selection of the monitoring of the test pads 2004 and 2006.

In an alternative embodiment, The enabling transistors 2003 may be on a gate or drain of a respective transistor 2002.

Figure 21:
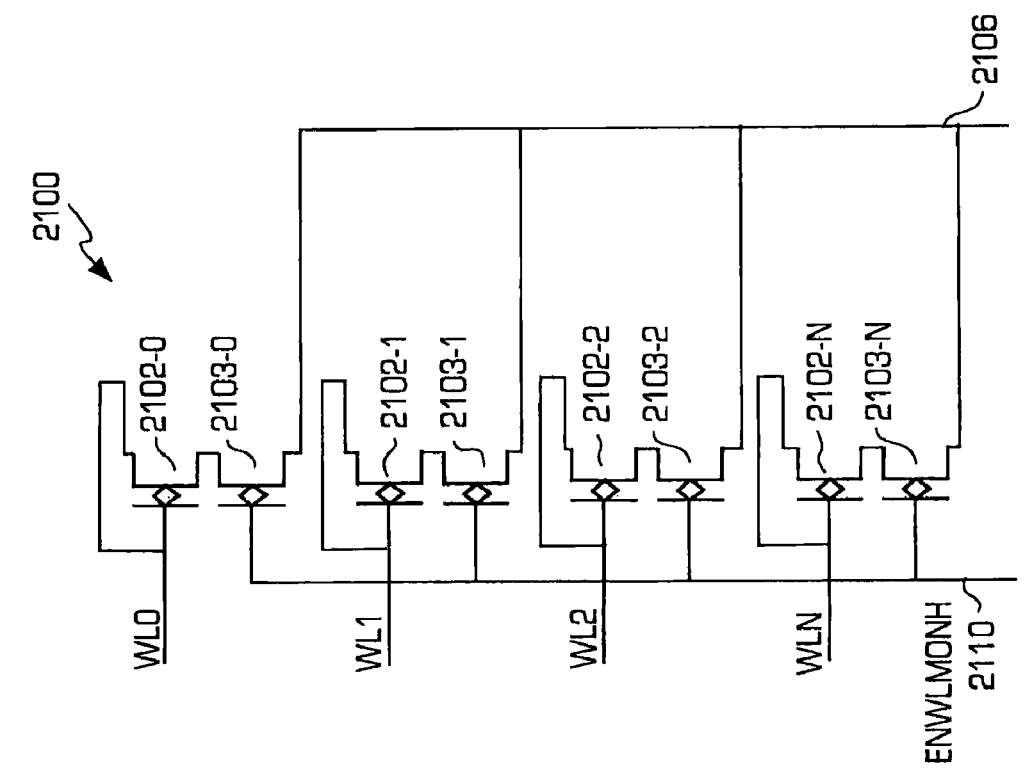
FIG. 21 is a schematic diagram illustrating a fourth embodiment of a test circuit for testing a plurality of memory cells.

FIG. 21 is a schematic diagram illustrating a test circuit 2100.

The test circuit 2100 comprises a plurality of NMOS transistors 2102-0 through 2100-N and a plurality of NMOS transistors 2103-0 through 2103-N. In an alternative embodiment, the transistors 2102 and 2103 may be NMOS transistors other than NZ NMOS transistors. Each NMOS transistor 2103-0 through 2103-N includes a gate coupled to an enable signal (ENWLMONH) and is coupled between a source of a corresponding NMOS transistor 2102-0 through 2102-N and a pad 2106. A corresponding word line WL0 through WLN is coupled to the gate of a respective diode connected NMOS transistor 2102-0 through 2102-N. The enable signal 2110 enables the NMOS transistors 2103 so that the NMOS transistors 2102 can function as a "winner-take-all" circuit. The NMOS transistors 2103 isolate the word lines when not in the test node. Any word line that is on controls the coupling of the first pad 2104 to the second pad 2106. As an illustrative example, the zero word line WL0 is set at 10 volts, the first word line WL1 is set to 5 volts and the remainder of the word lines WL2 through WLN are set to zero volts. The output on the second pad 2106 is the voltage of the highest voltage on one of the word lines less the threshold voltage of the transistor. In this illustrative example, the voltage on the pad 2106 is 10 volts minus VTZ (threshold voltage of the NZ transistor 2102) or approximately 10 volts.

In alternative embodiments, source lines or bit lines may be coupled to the gates of the NMOS transistors 2102. The test circuit 2100 does not use decoding for selection of the monitoring of the test pads 2104 and 2106.

In an alternative embodiment, The enabling transistors 2103 may be on a gate or drain of a respective transistor 2102.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

The invention claimed is:

1. A test transceiver comprising:
an ESD pad having a first terminal coupled to an input node and having a second terminal coupled to an output node; and
a resistive circuit having a first terminal coupled to the second terminal of the ESD pad and having a second terminal;
a connection circuit including an output terminal coupled to the first terminal of the resistive circuit, including at least one selection signal terminal; and including at least one internal node that provides signal thereon in response to a selection signal applied to a corresponding selection signal terminal.

2. The test transceiver of claim 1 further comprising:
at least two CMOS transmission gates in series between the internal node and the output node.

3. The test transceiver of claim 1 further comprising:
at least one disabled CMOS transmission gate having one terminal connected to the second terminal of the resistor and having another terminal connected to a power supply.

4. A test circuit comprising:
a first ESD protection circuit coupled to a first node;
a resistor having first and second terminals, said first terminal being coupled to the first node;
a boost circuit having a first terminal coupled to the second terminal of the resistor and having a second terminal coupled to a second node; and
a second ESD protection circuit coupled to the second terminal of the resistor.

5. The test circuit of claim 4 wherein the boost circuit comprising two NMOS transistors coupled in series between first and second terminals thereof.

6. The test circuit of claim 5 wherein the boost circuit comprises:
a clamp circuit coupled to a power supply and a gate of a first NMOS transistor of the boost circuit.

7. The test circuit of claim 5 wherein
a gate of the second NMOS transistor is coupled to a high power supply, and
a source of the second NMOS transistor is coupled to the second terminal of the boost circuit, and
a drain of the second NMOS transistor is coupled to a third terminal of the boost circuit].

8. The test circuit of claim 4 wherein the first ESD protection circuit includes four NMOS transistors coupled in series between ground and a high power supply.

9. The test circuit of claim 8 wherein gates of two NMOS transistors in the middle of the series of NMOS transistors are coupled capacitively to the input pad and coupled resistively to the ground.

10. The test circuit of claim 8 wherein gates of two NMOS transistors in the outside of the series of NMOS transistors are coupled capacitively to the input pad and coupled resistively to the high power supply.

\* \* \* \* \*